(12) United States Patent
Fukuoka et al.

(10) Patent No.: US 10,884,035 B2
(45) Date of Patent: Jan. 5, 2021

(54) SEMICONDUCTOR DEVICE, SEMICONDUCTOR SYSTEM, AND CONTROL METHOD OF SEMICONDUCTOR DEVICE

(71) Applicant: Renesas Electronics Corporation, Tokyo (JP)

(72) Inventors: Kazuki Fukuoka, Tokyo (JP); Toshifumi Uemura, Tokyo (JP); Yuko Kitaji, Tokyo (JP); Yosuke Okazaki, Tokyo (JP); Akira Murayama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/595,635

(22) Filed: Oct. 8, 2019

(65) Prior Publication Data

US 2020/0041547 A1  Feb. 6, 2020

Related U.S. Application Data

(63) Continuation of application No. 15/704,270, filed on Sep. 14, 2017, now Pat. No. 10,481,185.

(30) Foreign Application Priority Data

Sep. 30, 2016  (JP) .................................. 2016-192420

(51) Int. Cl.

| *G01R 27/26* | (2006.01) |
| *G01R 19/165* | (2006.01) |
| *G01R 31/28* | (2006.01) |
| *G06F 1/28* | (2006.01) |
| *H03K 5/133* | (2014.01) |
| *H03K 3/03* | (2006.01) |
| *G06F 1/24* | (2006.01) |

(Continued)

(52) U.S. Cl.
CPC ... *G01R 19/16552* (2013.01); *G01R 31/2851* (2013.01); *G01R 31/3177* (2013.01);

(Continued)

(58) Field of Classification Search
CPC ...... H03K 3/0315; H03K 5/133; H03K 17/22; H03K 2217/0027; H03K 3/011;

(Continued)

(56) References Cited

U.S. PATENT DOCUMENTS

| 5,485,111 A | 1/1996 | Tanimoto |
| 6,313,622 B1 * | 11/2001 | Seki ....................... H03K 5/135 |
| | | 324/76.54 |

(Continued)

FOREIGN PATENT DOCUMENTS

| JP | 06-296125 A | 10/1994 |
| JP | 08-274607 A | 10/1996 |

(Continued)

OTHER PUBLICATIONS

Feb. 27, 2018 European Search Report issued in European Patent Application No. 17185297.3.

(Continued)

*Primary Examiner* — Vinh P Nguyen
(74) *Attorney, Agent, or Firm* — Mattingly & Malur, PC

(57) ABSTRACT

A semiconductor device, a semiconductor system, and a control method of a semiconductor device are capable of accurately monitoring the lowest operating voltage of a circuit to be monitored. According to one embodiment, a monitor unit of a semiconductor system includes a voltage monitor that is driven by a second power supply voltage different from a first power supply voltage supplied to an internal circuit that is a circuit to be monitored and monitors the first power supply voltage, and a delay monitor that is driven by the first power supply voltage and monitors the signal propagation period of time of a critical path in the internal circuit.

15 Claims, 17 Drawing Sheets

(51) Int. Cl.
　　*G01R 31/317*　　　(2006.01)
　　*G01R 31/3177*　　(2006.01)
　　*G01R 31/3183*　　(2006.01)
　　*G01R 31/3193*　　(2006.01)

(52) U.S. Cl.
　　CPC . *G01R 31/31703* (2013.01); *G01R 31/31932* (2013.01); *G01R 31/31937* (2013.01); *G01R 31/318328* (2013.01); *G06F 1/24* (2013.01); *G06F 1/28* (2013.01); *H03K 3/0315* (2013.01); *H03K 5/133* (2013.01)

(58) Field of Classification Search
　　CPC ..... G06F 1/24; G06F 1/28; G01R 31/318328; G01R 19/16552; G01R 31/31703; G01R 31/31932; G01R 31/2851; G01R 31/31937; G01R 31/3177; G01R 19/16576
　　See application file for complete search history.

(56) References Cited

U.S. PATENT DOCUMENTS

| | | | |
|---|---|---|---|
| 6,924,679 B2 * | 8/2005 | Seno | ................ H03L 7/0996 327/158 |
| 8,004,348 B2 | 8/2011 | Ikenaga | |
| 8,004,351 B2 | 8/2011 | Kienaga | |
| 8,368,457 B2 | 2/2013 | Ikenaga | |
| 8,386,988 B2 | 2/2013 | Nomura | |
| 2002/0190283 A1 | 12/2002 | Seno | |
| 2010/0327961 A1 | 12/2010 | Ikenaga et al. | |
| 2011/0267115 A1 | 11/2011 | Yamamoto et al. | |
| 2012/0218005 A1 | 8/2012 | Chua-Eoan | |

FOREIGN PATENT DOCUMENTS

| | | | | |
|---|---|---|---|---|
| JP | 08274607 A | * | 10/1996 | ............. H03K 17/28 |
| JP | 2010-270643 A | | 12/2010 | |
| JP | 2011-061518 A | | 3/2011 | |
| JP | 2012-105190 A | | 5/2012 | |

OTHER PUBLICATIONS

Japanese Office Action received in corresponding Japanese Application No. 2016-192420 dated Feb. 18, 2020.

Japanese Office Action received in corresponding Japanese Application No. 2016-192420 dated Oct. 24, 2019.

* cited by examiner

FIG. 1
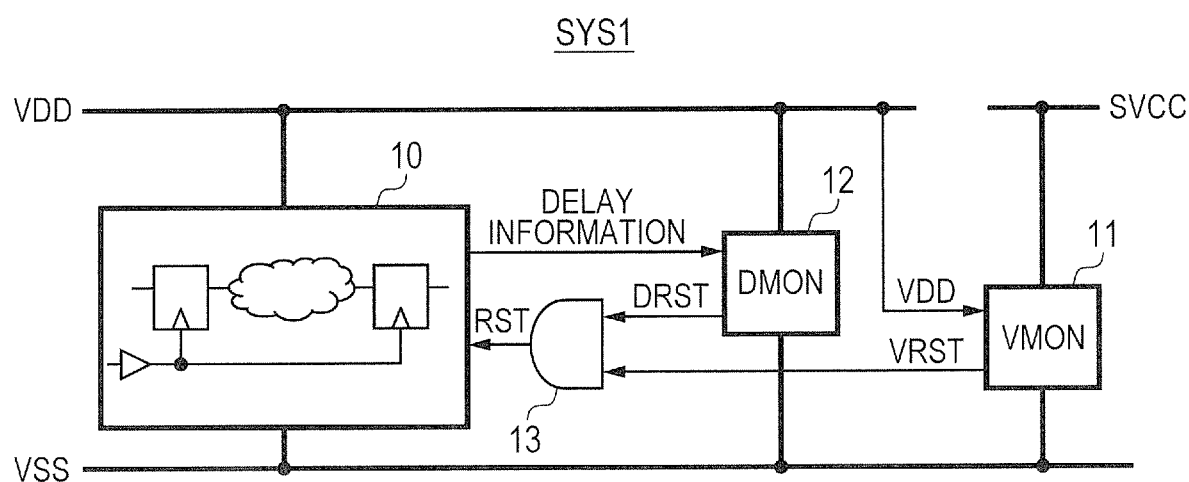
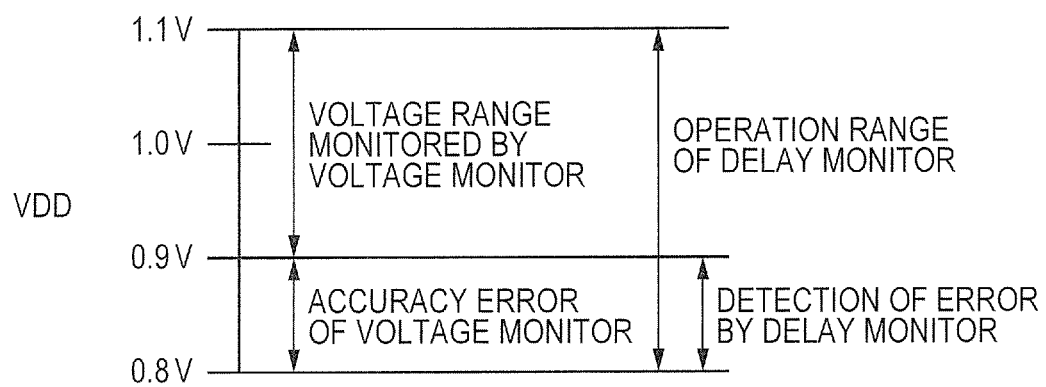

IN THE CASE OF HIGH-TEMPERATURE WORST CONDITION

IN THE CASE OF LOW-TEMPERATURE WORST CONDITION

FIG. 18
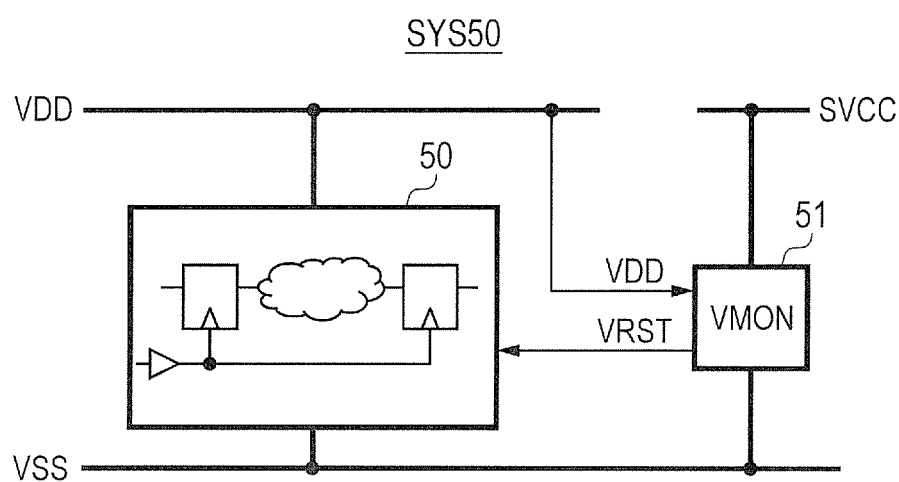
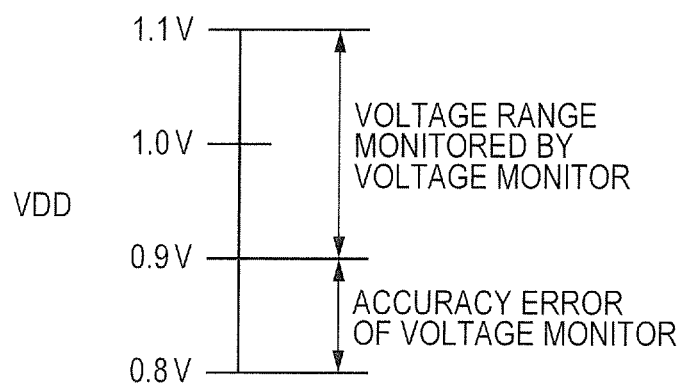

SEMICONDUCTOR DEVICE, SEMICONDUCTOR SYSTEM, AND CONTROL METHOD OF SEMICONDUCTOR DEVICE

CROSS-REFERENCE TO RELATED APPLICATIONS

This application is a continuation of Ser. No. 15/704,270 filed on Sep. 14, 2017, now U.S. Pat. No. 10,481,185.

The disclosure of Japanese Patent Application No. 2016-192420 filed on Sep. 30, 2016 including the specification, drawings and abstract is incorporated herein by reference in its entirety.

BACKGROUND

The present invention relates to a semiconductor device, a semiconductor system, and a control method of a semiconductor device, and particularly to a semiconductor device, a semiconductor system, and a control method of a semiconductor device suitable for accurately monitoring the lowest operating voltage of a circuit to be monitored.

In recent years, in order to guarantee an operation of an internal circuit driven by a power supply voltage, a semiconductor system has been provided with a monitor circuit to monitor whether or not the power supply voltage has dropped below the lowest operating voltage of the internal circuit.

For example, Japanese Unexamined Patent Application Publication No. Hei 6(1994)-296125 discloses a configuration of accurately detecting a power supply voltage without a malfunction even at a low voltage by combining a power supply voltage detection circuit with a large variation and a low lowest-operating-voltage and a power supply voltage detection circuit with high accuracy and a high lowest-operating-voltage to each other.

In addiction, Japanese Unexamined Patent Application Publication No. Hei 8(1996)-274607 discloses a configuration of monitoring a power supply voltage by measuring a propagation delay period of time using a ring oscillator.

SUMMARY

It has been known that the detection accuracy of a power supply voltage by a power supply voltage detection circuit is gradually deteriorated due to an influence of aged deterioration and the like. Here, in the configuration of Japanese Unexamined Patent Application Publication No. Hei 6(1994)-296125, there has been a problem that the detection accuracy of the power supply voltage is deteriorated due to an influence of aged deterioration because only two kinds of power supply voltage detection circuits are provided. The other objects and novel features will become apparent from the description of the specification and the accompanying drawings.

A semiconductor device according to one embodiment includes: a voltage monitor that is driven by a second power supply voltage different from a first power supply voltage supplied to a circuit to be monitored and monitors the first power supply voltage; and a delay monitor that is driven by the first power supply voltage and monitors the signal propagation period of time of a critical path in the circuit to be monitored.

In a control method of a semiconductor device according to one embodiment, a first power supply voltage is monitored using a voltage monitor driven by a second power supply voltage that is different from the first power supply voltage supplied to a circuit to be monitored, and the signal propagation period of time of a critical path in the circuit to be monitored is monitored using a delay monitor driven by the first power supply voltage.

According to the embodiment, it is possible to provide a semiconductor device, a semiconductor system, and a control method of a semiconductor device capable of accurately monitoring the lowest operating voltage of a circuit to be monitored.

BRIEF DESCRIPTION OF THE DRAWINGS

FIG. 1 is a diagram for explaining an outline of a semiconductor system according to a first embodiment;

FIG. 18 is a diagram for explaining an outline of a semiconductor system according to an idea before leading to the embodiment.

DETAILED DESCRIPTION

Figure 2:
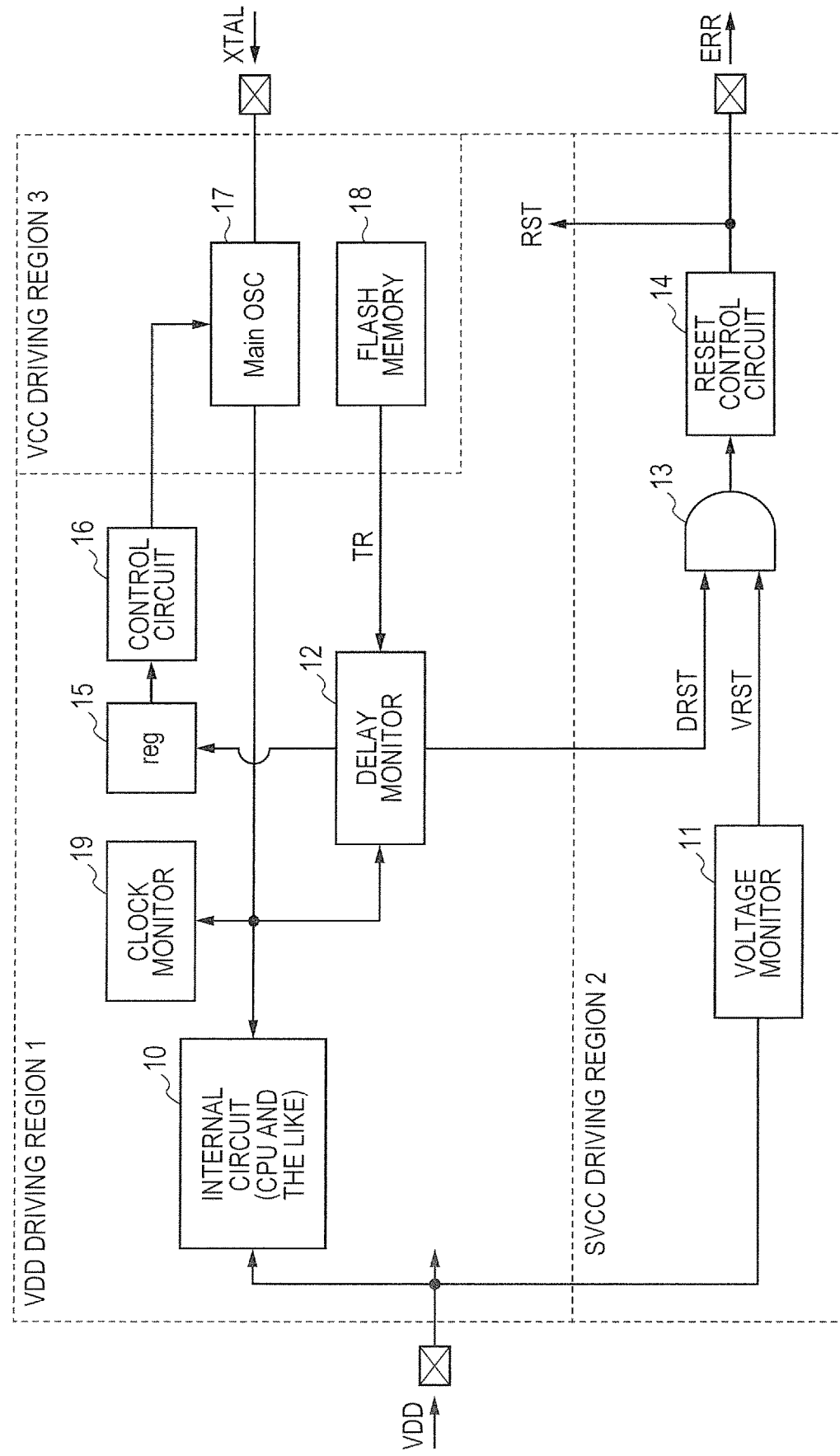
FIG. 2 is a block diagram for showing a configuration example of the semiconductor system according to the first embodiment.

Hereinafter, an embodiment will be described with reference to the drawings. It should be noted that since the drawings are simplified, the technical scope of the embodiment shall not be interpreted narrowly on the basis of the description of the drawings. Further, the same constitutional elements are followed by the same signs, and the duplicated explanation will be omitted.

The present invention will be described in the following embodiment while being divided into a plurality of sections or embodiments if necessary for convenience sake. However, except for a case especially specified, the sections or embodiments are not irrelevant to each other, and one has a relationship as a part or the entirety of a modified example, an application, a detailed explanation, or a supplementary explanation of the other. Further, if the specification refers to the number of elements (including the number of pieces, values, amounts, ranges, and the like) in the following embodiment, the present invention is not limited to the specific number, but may be smaller or larger than the specific number, except for a case especially specified or a case obviously limited to the specific number in principle.

Further, the components (including elemental steps and the like) are not necessarily essential in the following embodiment, except for a case especially specified or a case obviously deemed to be essential in principle. Likewise, if the specification refers to the shapes or positional relationships of the components in the following embodiment, the present invention includes those that are substantially close or similar to the components in shapes and the like, except for a case especially specified or a case obviously deemed not to be close or similar in principle. The same applies to the numbers (including the number of pieces, values, amounts, ranges, and the like).

<Preliminary Examination by Inventors>

Before describing the detail of a semiconductor system according to a first embodiment, a semiconductor system SYS50 examined by the inventors in advance will be described.

FIG. 18 is a diagram for explaining an outline of the semiconductor system SYS50 according to an idea before leading to the embodiment. As shown in FIG. 18, the semiconductor system SYS50 includes an internal circuit 50 and a voltage monitor 51.

The internal circuit 50 is driven by a power supply voltage VDD and has, for example, a CPU, peripheral circuits, and the like. It should be noted that the internal circuit 50 is a circuit to be monitored by the voltage monitor 51.

The voltage monitor 51 is driven by a power supply voltage SVCC that is different from the power supply voltage VDD, and monitors whether or not the power supply voltage VDD falls within a voltage range (operation guarantee voltage range) that guarantees the operation of the internal circuit 50.

Here, a case in which the operation guarantee voltage range of the internal circuit 50 is 0.9V to 1.1V will be described as an example. Thus, the voltage monitor 51 monitors whether or not the power supply voltage VDD falls within a voltage range of 0.9V to 1.1V.

For example, when the power supply voltage VDD drops to 0.9V that is the lowest operation guarantee voltage of the internal circuit 50, the voltage monitor 51 activates a reset signal VRST to initialize the internal circuit 50 before the internal circuit 50 does not normally operate.

Here, it has been known that the detection accuracy of the power supply voltage VDD by the voltage monitor 51 is gradually decreased due to an influence such as aged deterioration. For example, in the case where the accuracy error of the voltage monitor 51 is 0.1V, there is a possibility that the voltage monitor 51 does not initialize the internal circuit 50 until the power supply voltage VDD drops to 0.8V.

Therefore, the internal circuit 50 needs to be designed to operate even in the case where the power supply voltage VDD indicates 0.8V. In other words, the internal circuit 50 needs to be designed while adding a large voltage margin. In that case, there was a problem that the internal circuit 50 could not improve the operation frequency due to severe design restrictions.

Accordingly, a semiconductor system SYS1 according to the first embodiment having a monitoring function capable of accurately monitoring the lowest operating voltage of a circuit to be monitored has been found. Thereby, the circuit to be monitored can be designed with a small voltage margin. As a result, the operation frequency of the circuit to be monitored can be improved.

First Embodiment

FIG. 1 is a diagram for explaining an outline of a semiconductor system SYS1 according to a first embodiment. As shown in FIG. 1, the semiconductor system SYS1 includes an internal circuit 10, a voltage monitor 11, a delay monitor 12, and an AND circuit 13.

The internal circuit 10 is driven by a power supply voltage VDD and has, for example, a CPU, peripheral circuits, and the like. It should be noted that the internal circuit 10 is a circuit to be monitored by the voltage monitor 11 and the delay monitor 12.

The voltage monitor 11 is driven by a power supply voltage SVCC that is different from the power supply voltage VDD, and monitors whether or not the power supply voltage VDD falls within a voltage range (operation guarantee voltage range) that guarantees the operation of the internal circuit 10.

In the embodiment, a case in which the operation guarantee voltage range of the internal circuit 10 is 0.9V to 1.1V will be described as an example. Thus, the voltage monitor 11 monitors whether or not the power supply voltage VDD falls within a voltage range of 0.9V to 1.1V.

For example, when the power supply voltage VDD drops to 0.9V that is the lowest operation guarantee voltage of the internal circuit 10, the voltage monitor 11 activates a reset signal VRST before the internal circuit 10 does not normally operate.

The delay monitor 12 is driven by the power supply voltage VDD together with the internal circuit 10, and monitors whether or not the signal propagation period of time of a critical path in the internal circuit 10 falls within a predetermined period of time. The predetermined period of time is the longest propagation period of time allowed as the signal propagation period of time of the critical path.

For example, when the signal propagation period of time of the critical path becomes equal to or longer than the predetermined period of time as the power supply voltage VDD drops, the delay monitor 12 activates a reset signal DRST while the internal circuit 10 does not normally operate.

Here, it has been known that the detection accuracy of the power supply voltage VDD by the voltage monitor 11 is gradually decreased due to an influence such as aged deterioration. Therefore, for example, in the case where the accuracy error of the voltage monitor 11 is 0.1V, there is a possibility that the voltage monitor 11 does not initialize the internal circuit 10 until the power supply voltage VDD drops to 0.8V.

Accordingly, in consideration of the accuracy error of the voltage monitor 11, the delay monitor 12 is configured to operate even when the power supply voltage VDD drops below 0.9V that is the lowest operation guarantee voltage of the internal circuit 10. In other words, the delay monitor 12 is configured to operate even in the case where it is determined, by the voltage monitor 11 having an accuracy error, that the power supply voltage VDD has reached 0.9V that is the lowest operation guarantee voltage. In the embodiment, the delay monitor 12 is configured to operate even in the case where the power supply voltage VDD indicates 0.8V.

As described above, in the semiconductor system SYS1, the voltage monitor 11 monitors whether or not the power supply voltage VDD has dropped to 0.9V that is the lowest operation guarantee voltage of the internal circuit 10, and the delay monitor 12 monitors whether or not the signal propagation period of time of the critical path in the internal circuit 10 is within an allowable range even in the voltage range of 0.8V to 0.9V that is the accuracy error range of the voltage monitor 11. Namely, even in the case where the voltage monitor 11 has an accuracy error, the delay monitor 12 can accurately monitor whether or not the power supply voltage VDD has reached the actual lowest operating voltage of the internal circuit 10.

Accordingly, it is possible to design the internal circuit 10 with a small voltage margin without considering the accuracy error of the voltage monitor 11. Namely, the internal circuit 10 may be designed to, at least, operate in the case where the power supply voltage VDD is 0.9V or higher in the present embodiment. As a result, the internal circuit 10 can improve the operation frequency by relaxing the design restrictions.

(Details of Semiconductor System SYS1)

Next, the details of the semiconductor system SYS1 will be described with reference to FIG. 2 to FIG. 4.

FIG. 2 is a block diagram for showing a configuration example of the semiconductor system SYS1.

As shown in FIG. 2, the semiconductor system SYS1 is configured using a VDD driving region 1 driven by the power supply voltage VDD, an SVCC driving region 2 driven by the power supply voltage SVCC, and a VCC driving region 3 driven by a power supply voltage VCC. It should be noted that the power supply voltages VDD, SVCC, and VCC are supplied from power sources that are different from each other.

In the embodiment, a case in which the semiconductor system SYS1 is provided on one chip will be described as an example, but the present invention is not limited to this case. The semiconductor system SYS1 may be divided and provided on a plurality of chips.

The VDD driving region 1 is provided with the internal circuit 10, the delay monitor 12, a frequency information storage register 15, a control circuit 16, and a clock monitor 19. The SVCC driving region 2 is provided with the voltage monitor 11, an AND circuit 13, and a reset control circuit 14. The VCC driving region 3 is provided with a main oscillator 17 and a flash memory 18.

Figure 3:
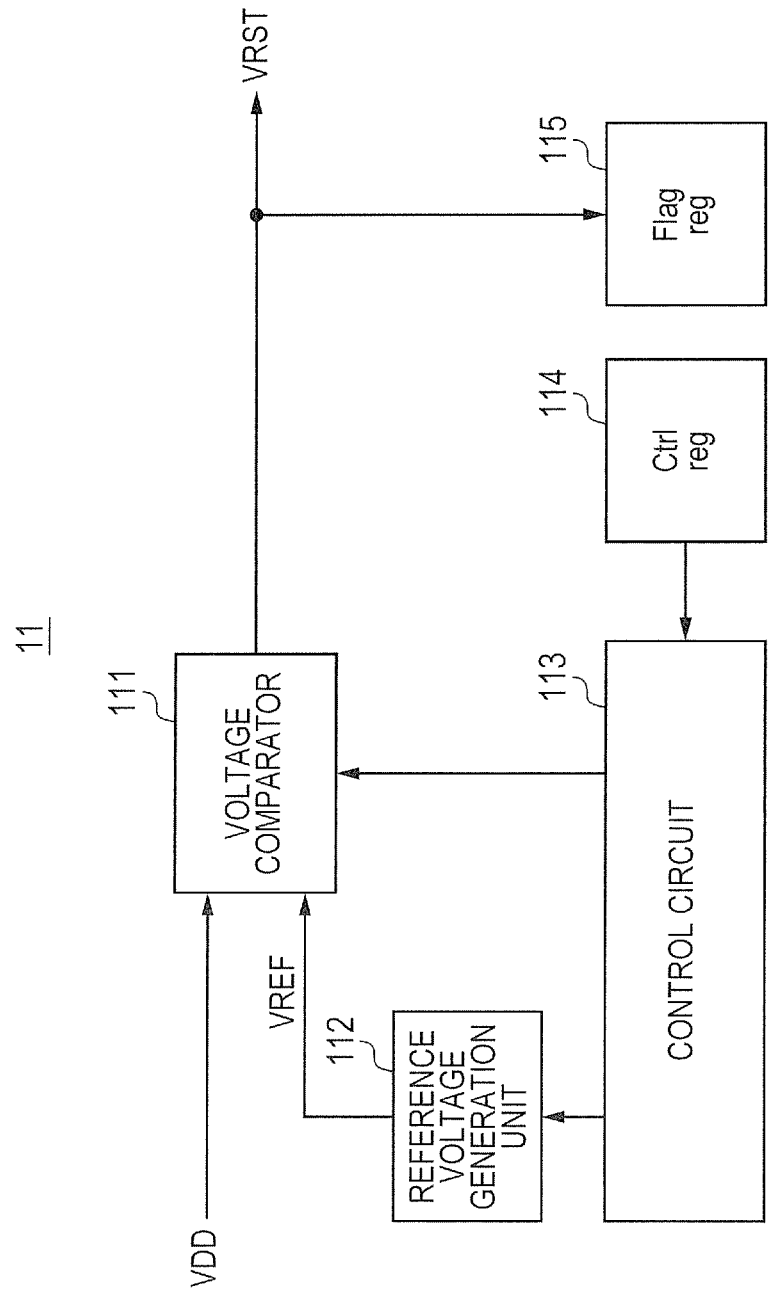
FIG. 3 is a block diagram for showing a configuration example of a voltage monitor provided in the semiconductor system shown in FIG. 2.

FIG. 3 is a block diagram for showing a configuration example of the voltage monitor 11.

With reference to FIG. 3, the voltage monitor 11 has a voltage comparator 111, a reference voltage generation unit 112, a control circuit 113, a setting information storage register 114, and a flag storage register 115.

Setting information necessary for the voltage monitor 11 is provided and stored into the setting information storage register 114 from, for example, the CPU. The control circuit 113 controls the value of a reference voltage VREF generated by the reference voltage generation unit 112 and the comparison accuracy of the voltage comparator 111 on the basis of the setting information stored in the setting information storage register 114. The voltage comparator 111 compares the reference voltage VREF from the reference voltage generation unit 112 with the power supply voltage VDD, and outputs the reset signal VRST in accordance with the comparison result. The flag storage register 115 stores information (error flag) in the case where the reset signal VRST becomes active. It should be noted that the information stored in the flag storage register 115 is held even in the case where the internal circuit 10 is initialized.

For example, the reference voltage VREF is set to 0.9V. Further, the voltage comparator 111 keeps the reset signal VRST inactive in the case where the power supply voltage VDD is higher than the reference voltage VREF, and activates the reset signal VRST in the case where the power supply voltage VDD becomes equal to or lower than the reference voltage VREF.

Figure 4:
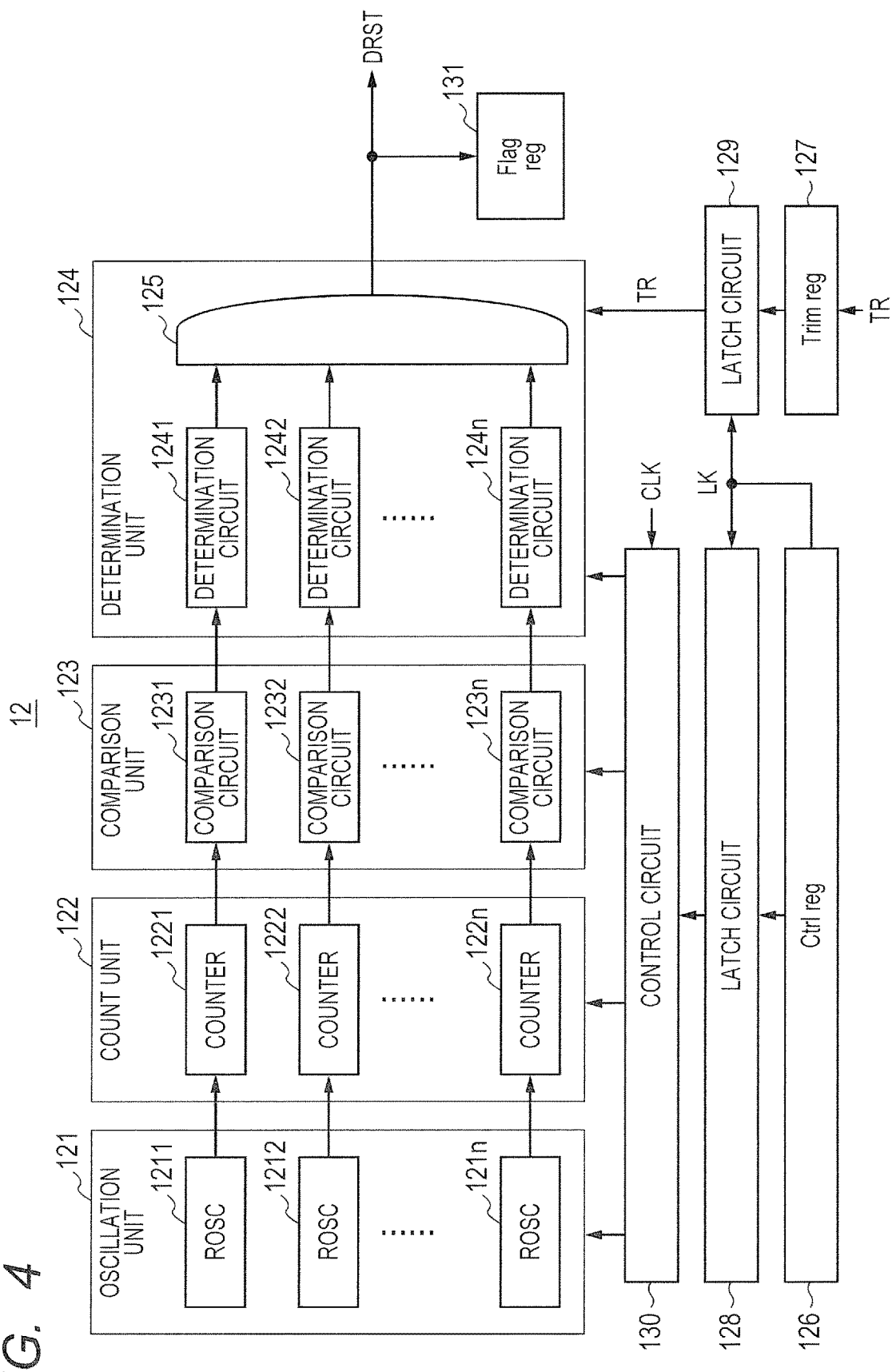
FIG. 4 is a block diagram for showing a configuration example of a delay monitor provided in the semiconductor system shown in FIG. 2.

FIG. 4 is a block diagram for showing a configuration example of the delay monitor 12.

With reference to FIG. 4, the delay monitor 12 has an oscillation unit 121, a count unit 122, a comparison unit 123, a determination unit 124, a setting information storage register 126, a threshold value storage register 127, latch circuits 128 and 129, a control circuit 130, and a flag storage register 131.

A predetermined threshold value TR read from the flash memory 18 is stored into the threshold value storage register 127. It should be noted that a method of determining the threshold value TR stored in the flash memory 18 will be described later. Setting information necessary for the delay monitor 12 is provided and stored into the setting information storage register 126 from, for example, the CPU.

It should be noted that the delay monitor 12 needs to operate even when the power supply voltage VDD drops below 0.9V in consideration of the accuracy error of the voltage monitor 11. Therefore, the information stored in the registers 126 and 127 is latched to the latch circuits 128 and 129, respectively, in synchronization with, for example, a lock signal LK from the setting information storage register 126. Accordingly, even in the case where unintended information is newly stored in the registers 126 and 127 due to the drop of the power supply voltage VDD, the delay monitor 12 is not affected.

The control circuit 130 controls the oscillation unit 121, the count unit 122, the comparison unit 123, and the determination unit 124 on the basis of the setting information latched by the latch circuit 128. Specifically, the control circuit 130 controls whether or not to drive the oscillation unit 121, a count period by the count unit 122, the comparison accuracy by the comparison unit 123, and a determination criterion by the determination unit 124.

The oscillation unit 121 is a unit (delay information generation unit) composed of n (n is a natural number) paths corresponding to the critical paths of the internal circuit 10. For example, the oscillation unit 121 has n ring oscillators 121_1 to 121_n that are configured using transistors used for the internal circuit 10 and are different from each other in temperature dependency, voltage dependency, and process dependency. Here, the delay monitor 12 monitors whether or not the signal propagation period of time of the critical path in the internal circuit 10 is within an allowable range by monitoring the number of times of oscillation (corresponding to the signal propagation period of time) per predetermined period of time of the ring oscillators 121_1 to 121_n that are different from each other in characteristic.

The count unit 122 counts the number of times of oscillation per predetermined period of time by the oscillation unit 121. Specifically, the count unit 122 has n counters 1221 to 122n. The counters 1221 to 122n count the number of times of oscillation per predetermined period of time by the ring oscillators 1211 to 121n, respectively. It should be noted that the frequency of each ring oscillator is decreased when the power supply voltage VDD is decreased, and thus the number of times of oscillation per predetermined period of time is reduced.

The comparison unit 123 compares the count value of the count unit 122 with the preliminarily-set threshold value TR. Specifically, the comparison unit 123 has n comparison circuits 1231 to 123n. The comparison circuits 1231 to 123n compare the count values of the counters 1221 to 122n with the n threshold values TR set in advance in association therewith.

The determination unit 124 outputs the reset signal DRST in accordance with the comparison result of the comparison unit 123. Specifically, the determination unit 124 has n determination circuits 1241 to 124n and an AND circuit 125. The determination circuits 1241 to 124n output determination results in accordance with the comparison results of the comparison circuits 1231 to 123n, respectively.

For example, in the case where the count values of the counters 1221 to 122n are higher than the corresponding threshold values TR, each of the determination circuits 1241 to 124n outputs a determination result of "H" level. In the case where the count values of the counters 1221 to 122n are equal to or lower than the corresponding threshold values TR, each of the determination circuits 1241 to 124n outputs a determination result of "L" level. It should be noted that in the case where each of the numbers of times that the count values become equal to or lower than the threshold values TR reaches a predetermined number, each of the determination circuits 1241 to 124n may output a determination result of "L" level.

The AND circuit 125 outputs the logical product of the determination results of the determination circuits 1241 to 124n as the reset signal DRST. For example, in the case where all the determination circuits 1241 to 124n are at "H" level, the AND circuit 125 keeps the reset signal DRST inactive ("H" level). In the case where any one of the determination circuits 1241 to 124n becomes "L" level, the AND circuit 125 activates the reset signal DRST ("L" level).

In the case where the reset signal DRST becomes active, the flag storage register 131 stores the information (error flag). It should be noted that the information stored in the flag storage register 131 is held even in the case where the internal circuit 10 is initialized.

The explanation will be continued by returning to FIG. 2.

The AND circuit 13 outputs the logical product of the reset signal VRST of the voltage monitor 11 and the reset signal DRST of the delay monitor 12. The reset control circuit 14 outputs a reset signal RST in accordance with the output signal of the AND circuit 13. The reset signal RST initializes the circuits of the VDD driving region 1 when being active (at the time of "L" level), and is output to the outside of the semiconductor system SYS1 as an error signal ERR that notifies the presence or absence of occurrence of an error. It should be noted that the reset control circuit 14 may be omitted if not necessary. In this case, the output of the AND circuit 13 is used as the reset signal RST.

Information of the frequency set in the main oscillator 17 is provided and stored into the frequency information storage register 15 from, for example, the CPU. The control circuit 16 oscillates the main oscillator 17 on the basis of the frequency information stored in the frequency information storage register 15. Accordingly, the main oscillator 17 outputs a clock signal CLK having the frequency specified by the control circuit 16. The clock signal CLK is supplied to the internal circuit 10, the delay monitor 12, the clock monitor 19, and the like.

The clock monitor 19 monitors whether or not the clock signal CLK from the main oscillator 17 has a desired frequency. After the operation of the clock signal CLK is confirmed by the clock monitor 19 and after the self-diagnosis of the delay monitor 12, for example, the CPU switches the operation clock from a low-speed clock signal by a built-in oscillator iOCO to a high-speed clock signal generated by multiplying the clock signal CLK from the main oscillator 17 using PLL.

It should be noted that the information of the frequency stored in the frequency information storage register 15 is locked by the lock signal LK output from the delay monitor 12 after the self-diagnosis. Accordingly, it is possible to prevent the main oscillator 17 from oscillating at an unintended frequency due to the drop of the power supply voltage VDD.

(Concrete Example of Delay Monitor 12)

The delay monitor 12 will be described in more detail by using a concrete example.

Figure 5:
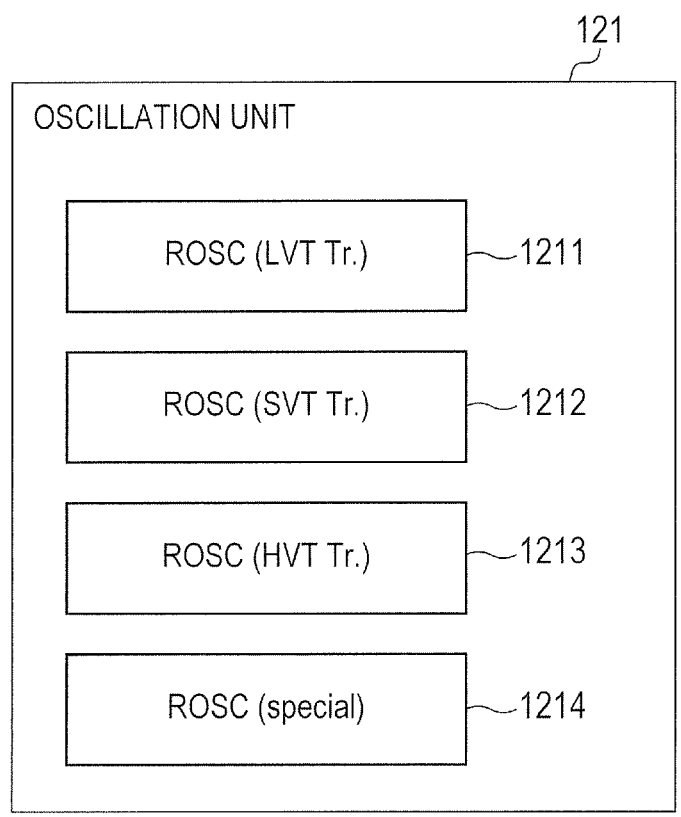
FIG. 5 is a block diagram for showing a configuration example of an oscillation unit provided in the delay monitor shown in FIG. 4.

FIG. 5 is a block diagram for showing a concrete example of the oscillation unit 121.

In the example of FIG. 5, the oscillation unit 121 has four ring oscillators 1211 to 1214. For example, among transistors having three kinds of threshold voltages used for the internal circuit 10, the ring oscillator 1211 is configured using one having the lowest threshold voltage LVT. The ring oscillator 1212 is configured using one having the intermediate threshold voltage SVT. The ring oscillator 1213 is configured using one having the highest threshold voltage HVT. The ring oscillator 1214 is configured to have temperature dependency opposite to that of the ring oscillators 1211 to 1213. It should be noted that the ring oscillator 1214 is provided on the assumption that a critical path having temperature dependency opposite to that of the ring oscillators 1211 to 1213 exists.

Figure 6:
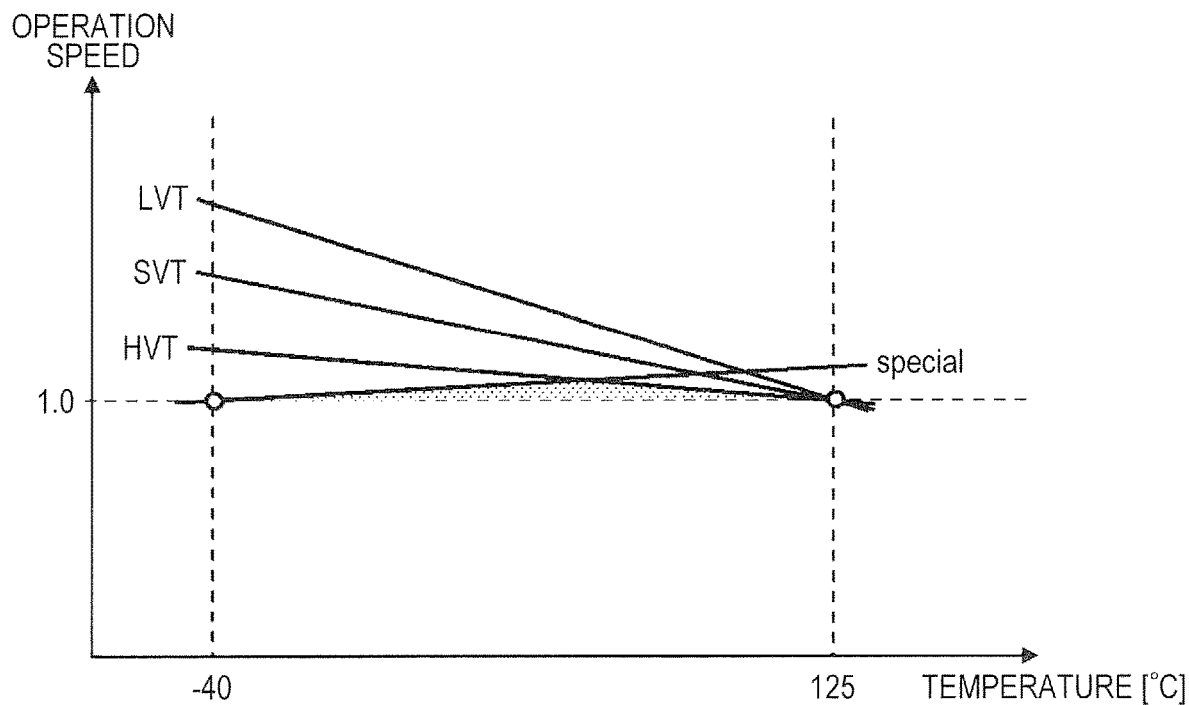
FIG. 6 is a diagram for showing a relationship between the temperature and the operation speed of each ring oscillator provided in the oscillation unit shown in FIG. 5 under the high-temperature worst condition.
Figure 7:
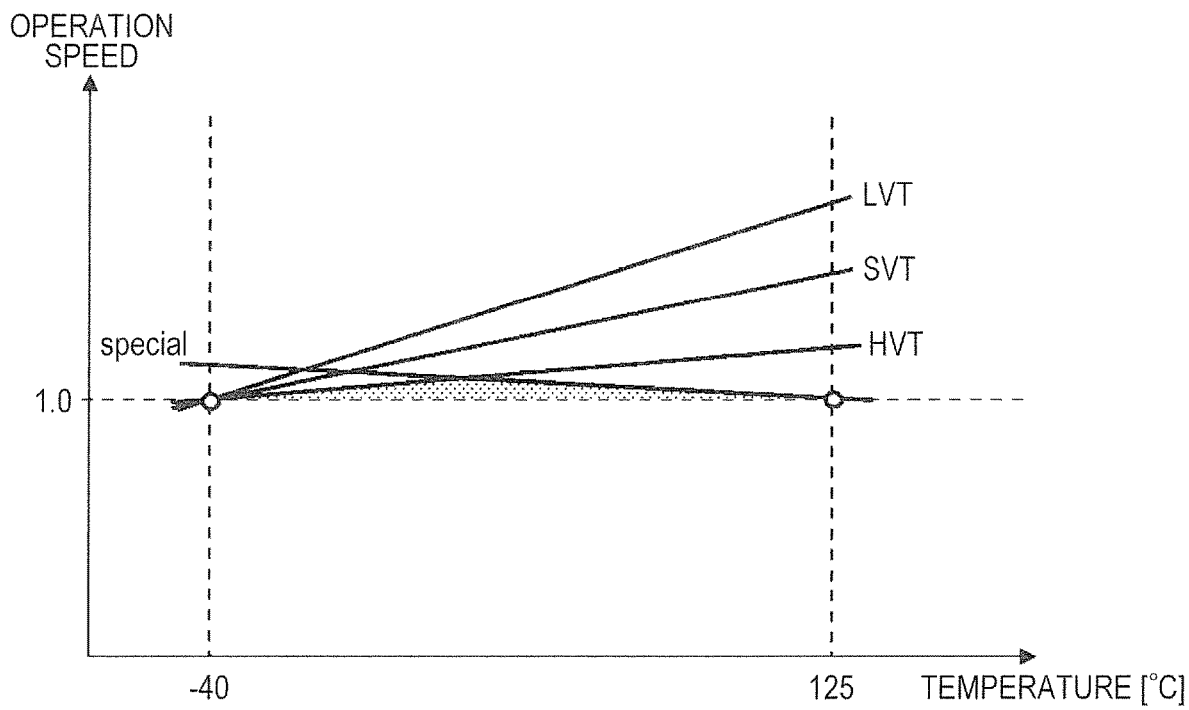
FIG. 7 is a diagram for showing a relationship between the temperature and the operation speed of each ring oscillator provided in the oscillation unit shown in FIG. 5 under the low-temperature worst condition.

FIG. 6 is a diagram for showing a relationship between the operation speed and the temperature of each of the ring oscillators 1211 to 1214 under the high-temperature worst condition. FIG. 7 is a diagram for showing a relationship between the operation speed and the temperature of each of the ring oscillators 1211 to 1214 under the low-temperature worst condition. It should be noted that the operation speed of each ring oscillator means the operation frequency. As the operation speed increases, the number of times of oscillation (count value) per predetermined period increases. As the operation speed decreases, the number of times of oscillation (count value) per predetermined period decreases.

Under the high-temperature worst condition shown in FIG. 6, the operation speed of each of the ring oscillators 1211 to 1213 becomes slower as the temperature rises, and becomes faster as the temperature lowers. However, as an exception, the operation speed of the ring oscillator 1214 having temperature dependency opposite to that of the ring oscillators 1211 to 1213 becomes opposite.

Therefore, the trimming for determining the threshold value set corresponding to the number of times of oscillation of each of the ring oscillators 1211 to 1213 is carried out at a high temperature (125° C.) at which the operation speed becomes the slowest. In contrast, the trimming for determining the threshold value set corresponding to the number of times of oscillation of the ring oscillator 1214 is carried out at a low temperature (−40° C.) at which the operation speed becomes the slowest.

Under the low-temperature worst condition shown in FIG. 7, the operation speed of each of the ring oscillators 1211 to 1213 becomes faster as the temperature rises, and becomes slower as the temperature lowers. However, as an exception, the operation speed of the ring oscillator 1214 having temperature dependency opposite to that of the ring oscillators 1211 to 1213 becomes opposite.

Therefore, the trimming for determining the threshold value set corresponding to the number of times of oscillation of each of the ring oscillators 1211 to 1213 is carried out at a low temperature (−40° C.) at which the operation speed becomes the slowest. In contrast, the trimming for determining the threshold value set corresponding to the number of times of oscillation of the ring oscillator 1214 is carried out at a high temperature (125° C.) at which the operation speed becomes the slowest.

(Concrete Configuration Example of Ring Oscillators 1211 to 1213)

Figure 8:
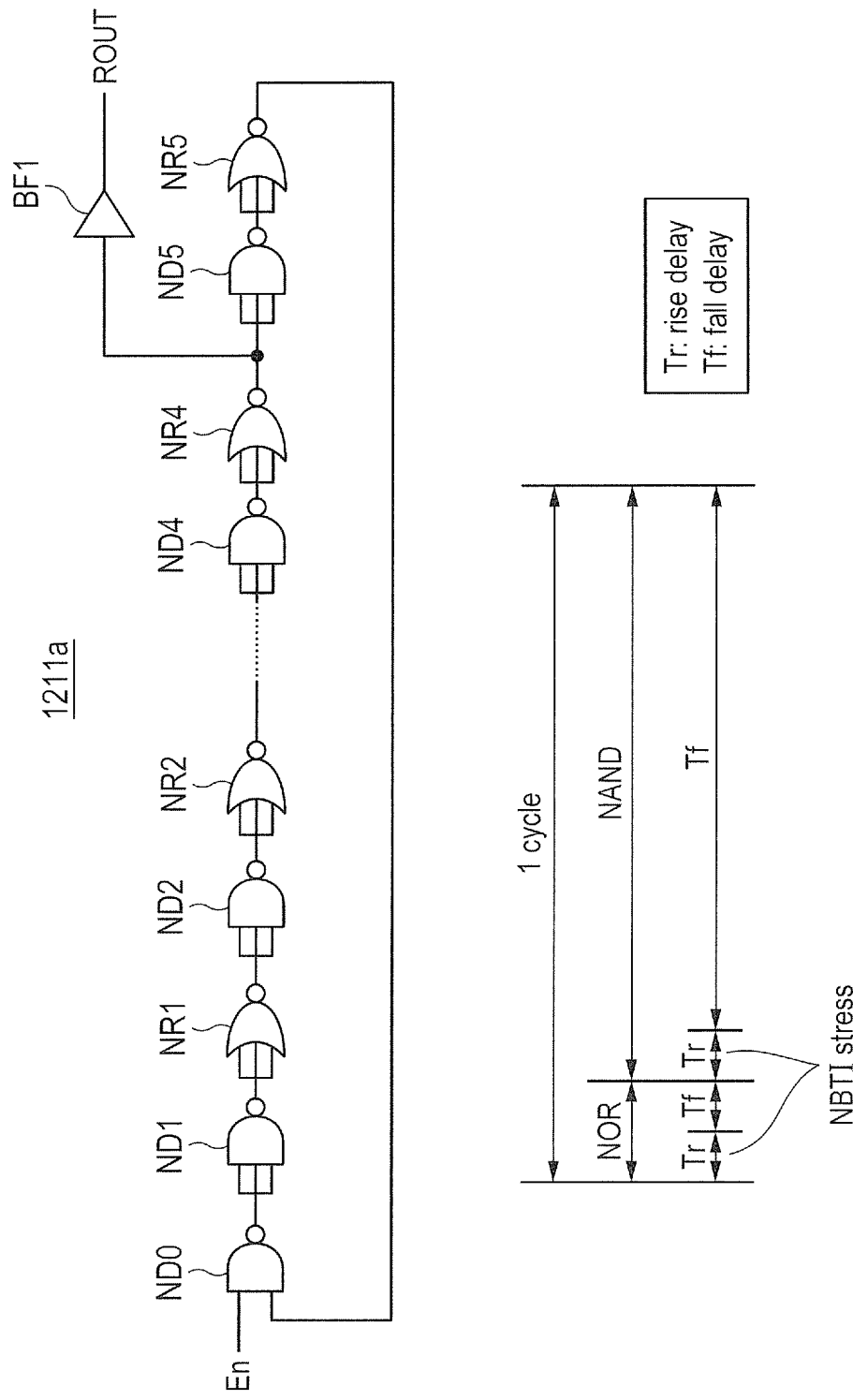
FIG. 8 is a diagram for showing a concrete configuration example of the ring oscillator provided in the oscillation unit shown in FIG. 5.

FIG. 8 is a diagram for showing a concrete configuration example of the ring oscillator 1211 as a ring oscillator 1211*a*. It should be noted that the ring oscillator 1211*a* is configured using the transistor having the lowest threshold voltage LVT.

As shown in FIG. 8, the ring oscillator 1211*a* has five sets of NAND circuits ND1 to ND5 and NOR circuits NR1 to NR5, a NAND circuit ND0, and a buffer BF1. It should be noted that the number of sets of NAND circuits and NOR circuits is not limited to five sets, and can be changed to an arbitrary number.

The NAND circuits ND1 to ND5 and the NOR circuits NR1 to NR5 are alternately provided in a ring shape. The NAND circuit ND0 is provided on the ring formed by the NAND circuits ND1 to ND5 and the NOR circuits NR1 to NR5, and controls the presence or absence of oscillation by using an enable signal En from the outside. The buffer BF1 outputs the voltage of a node on the ring as an oscillation signal.

Here, the ring oscillator 1211*a* employs an asymmetric structure in order to suppress the accuracy error due to aged deterioration. Specifically, the drive capability of each of the NOR circuits NR1 to NR5 is, for example, nine times larger than that of each of the NAND circuits ND1 to ND5. Further, in order to reduce the influence of the NBTI (Negative Bias Temperature Instability) deterioration that is dominant in aged deterioration, a ratio of the rising period of the oscillation signal to one cycle is reduced by increasing the drive capability of a PMOS transistor. Accordingly, the ring oscillator 1211*a* can suppress an increase in accuracy error due to the NBTI deterioration that is dominant in aged deterioration.

It should be noted that the HCI (Hot Carrier Injection) deterioration is likely to occur in an NMOS transistor, and there is a possibility of causing deterioration of the falling period of the oscillation signal. However, in a NAND circuit having a long falling period, a plurality of NMOS transistors is vertically stacked, and the voltage between the source and the drain of each NMOS transistor is small. Thus, the NAND circuit is hardly affected by the HCI deterioration. Therefore, the ring oscillator 1211*a* can suppress an increase in accuracy error due to the HCI deterioration.

The configurations of the ring oscillators 1212 and 1213 are the same as that of the ring oscillator 1212*a* except that the ring oscillators 1212 and 1213 are configured using the transistors having the threshold voltages SVT and HVT, respectively. Thus, the explanation thereof is omitted.

(First Concrete Configuration Example of Ring Oscillator 1214)

Figure 9:
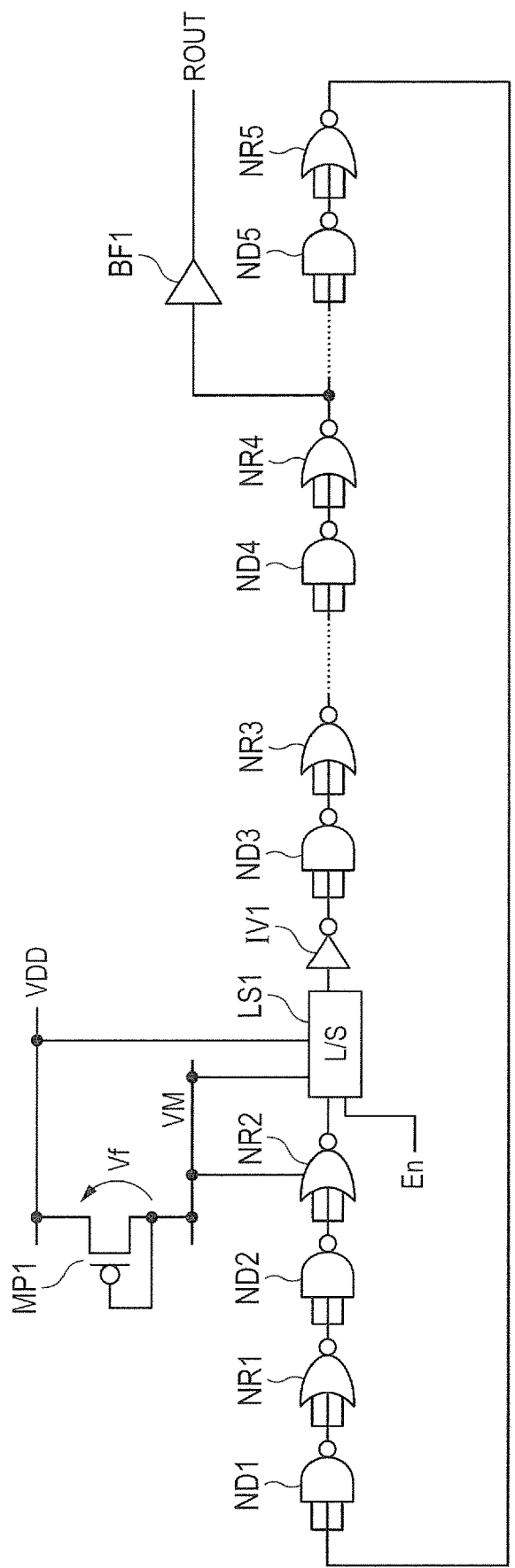
FIG. 9 is a diagram for showing a concrete configuration example of the ring oscillator provided in the oscillation unit shown in FIG. 5.

FIG. 9 is a diagram for showing a first concrete configuration example of the ring oscillator 1214 as a ring oscillator 1214*a*. In the example of FIG. 9, by using a transistor having high-temperature worst temperature dependency, the ring oscillator 1214*a* having temperature dependency opposite thereto is realized.

As shown in FIG. 9, the ring oscillator 1214*a* has five sets of NAND circuits ND1 to ND5 and NOR circuits NR1 to NR5, a level shifter LS1, an inverter IV1, a PMOS transistor (hereinafter, simply referred to as a transistor) MP1, and a buffer BF1. It should be noted that the number of sets of NAND circuits and NOR circuits is not limited to five sets, and can be changed to an arbitrary number.

The NAND circuits ND1 to ND5 and the NOR circuits NR1 to NR5 are alternately provided in a ring shape. The level shifter LS1 is provided on the ring formed by the NAND circuits ND1 to ND5 and the NOR circuits NR1 to NR5, and controls the presence or absence of a level shift (namely, the presence or absence of oscillation) by using an enable signal En from the outside. The inverter IV1 outputs an inverted signal of the output of the level shifter LS1. In the example of FIG. 9, the level shifter LS1 and the inverter IV1 are provided between the NOR circuit NR2 and the NAND circuit ND3. The transistor MP1 is diode-connected between the line of the power supply voltage VDD and the line of an intermediate voltage VM. The NOR circuit NR2 is driven by the intermediate voltage VM instead of the power supply voltage VDD. The buffer BF1 outputs the voltage of a node on the ring as an oscillation signal.

Here, when the temperature is high, the drop voltage Vf of the diode becomes small and the intermediate voltage VM becomes large. Thus, the amount of current supplied to the NOR circuit NR2 is increased. As a result, the oscillation frequency of the ring oscillator 1214*a* is increased. On the contrary, when the temperature is low, the drop voltage Vf of the diode becomes large and the intermediate voltage VM becomes small. Thus, the amount of current supplied to the NOR circuit NR2 is decreased. As a result, the oscillation frequency of the ring oscillator 1214*a* is decreased. Namely, the ring oscillator 1214*a* can have low-temperature worst temperature dependency that the oscillation frequency (the number of times of oscillation per predetermined period) is decreased as the temperature lowers irrespective of the high-temperature worst condition.

(Second Concrete Configuration Example of Ring Oscillator 1214)

Figure 10:
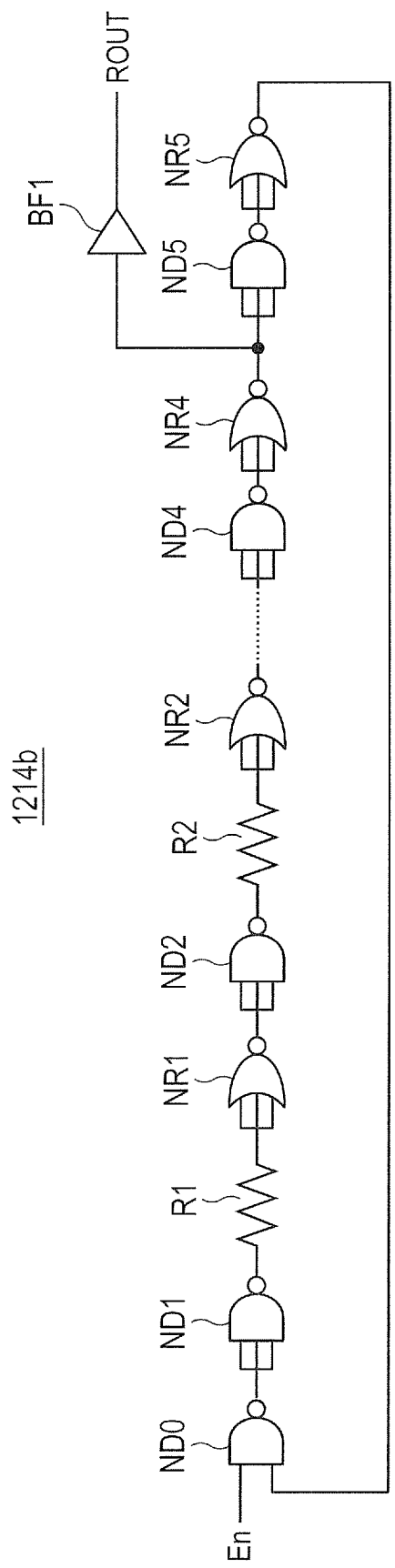
FIG. 10 is a diagram for showing a concrete configuration example of the ring oscillator provided in the oscillation unit shown in FIG. 5.

FIG. 10 is a diagram for showing a second concrete configuration example of the ring oscillator 1214 as a ring oscillator 1214*b*. In the example of FIG. 10, by using a transistor having low-temperature worst temperature dependency, the ring oscillator 1214*b* having temperature dependency opposite thereto is realized.

As shown in FIG. 10, the ring oscillator 1214*b* has five sets of NAND circuits ND1 to ND5 and NOR circuits NR1 to NR5, a NAND circuit ND0, resistance elements R1 and R2, and a buffer BF1. It should be noted that the number of sets of NAND circuits and NOR circuits is not limited to five sets, and can be changed to an arbitrary number.

The NAND circuits ND1 to ND5 and the NOR circuits NR1 to NR5 are alternately provided in a ring shape. The NAND circuit ND0 is provided on the ring formed by the NAND circuits ND1 to ND5 and the NOR circuits NR1 to NR5, and controls the presence or absence of oscillation by using an enable signal En from the outside. The resistance elements R1 and R2 are also provided on the ring. The buffer BF1 outputs the voltage of a node on the ring as an oscillation signal.

Here, when the temperature is high, the signal propagation delay of the resistance elements R1 and R2 becomes large, and thus the oscillation frequency of the ring oscillator 1214b is decreased. On the contrary, when the temperature is low, the signal propagation delay of the resistance elements R1 and R2 becomes small, and thus the oscillation frequency of the ring oscillator 1214b is increased. Namely, the ring oscillator 1214b can have high-temperature worst temperature dependency that the oscillation frequency (the number of times of oscillation per predetermined period) is decreased as the temperature rises irrespective of the low-temperature worst condition.

(Operation of Semiconductor System SYS1)

Next, an operation of the semiconductor system SYS1 will be described.

Figure 11:
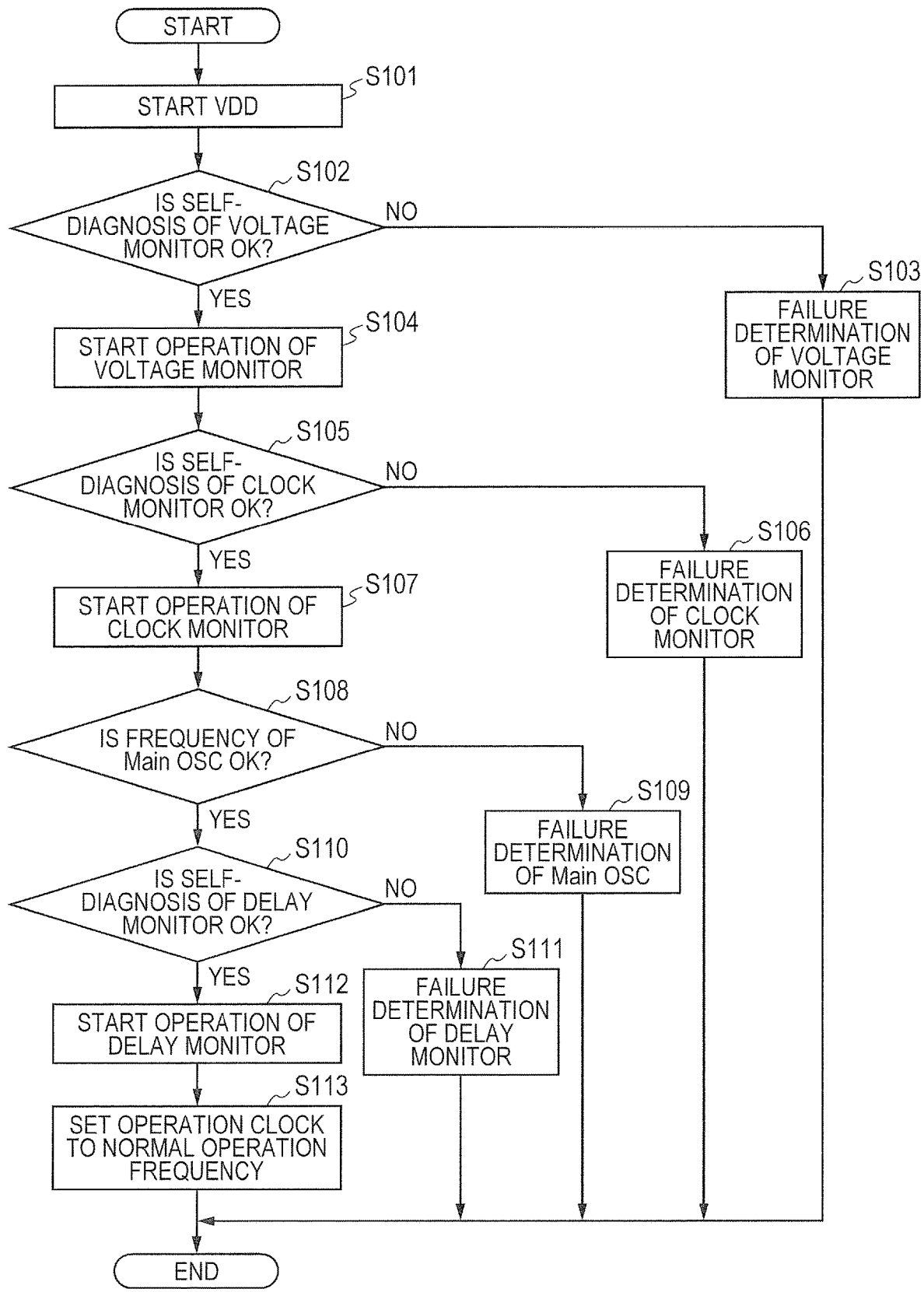
FIG. 11 is a flowchart for showing a start-up operation of the semiconductor system shown in FIG. 2.

FIG. 11 is a flowchart for showing a start-up operation of the semiconductor system SYS1.

As shown in FIG. 11, in the start-up operation of the semiconductor system SYS1, the power supply voltage VDD is started first (Step S101), and then the self-diagnosis of the voltage monitor (VMON) 11 is performed by the CPU in the internal circuit 10 (Step S102). If there is a problem in the diagnostic result (NO in Step S102), it is determined that the voltage monitor 11 is broken (Step S103), and the operation is finished. If there is no problem in the diagnostic result (YES in Step S102), the voltage monitor 11 starts the monitoring operation (Step S104).

Thereafter, the CPU performs the self-diagnosis of the clock monitor (CLMON) 19 (Step S105). If there is a problem in the diagnostic result (NO in Step S105), it is determined that the clock monitor 19 is broken (Step S106), and the operation is finished. If there is no problem in the diagnostic result (YES in Step S105), the clock monitor 19 starts the monitoring operation (Step S107).

Thereafter, the clock monitor 19 performs the frequency diagnosis of the clock signal CLK generated by the main oscillator 17 (Step S108). In the case where the frequency of the clock signal CLK is not the desired frequency (NO in Step S108), it is determined that the main oscillator 17 is broken (Step S109), and the operation is finished. In the case where the frequency of the clock signal CLK is the desired frequency (YES in Step S108), namely, in the case where the power supply voltage VDD and the clock signal CLK supplied to the delay monitor (DMON) 12 are determined to be normal, the CPU performs the self-diagnosis of the delay monitor (DMON) 12 (Step S110).

If there is a problem in the result of the self-diagnosis of the delay monitor 12 (NO in Step S110), it is determined that the delay monitor 12 is broken (Step S111), and the operation is finished. If there is no problem in the result of the self-diagnosis of the delay monitor 12 (YES in Step S110), the delay monitor 12 starts the monitoring operation (Step S112). Namely, the monitoring operation is started by all the monitor circuits.

Accordingly, the CPU switches the operation clock from a low-speed clock signal by the built-in oscillator iOCO to a high-speed clock signal generated by multiplying the clock signal CLK from the main oscillator 17 (Step S113). Accordingly, the semiconductor system SYS1 can perform a normal operation including the monitoring operation by each monitor circuit.

(Concrete Example of Self-Diagnosis Method of Delay Monitor 12)

Figure 12:
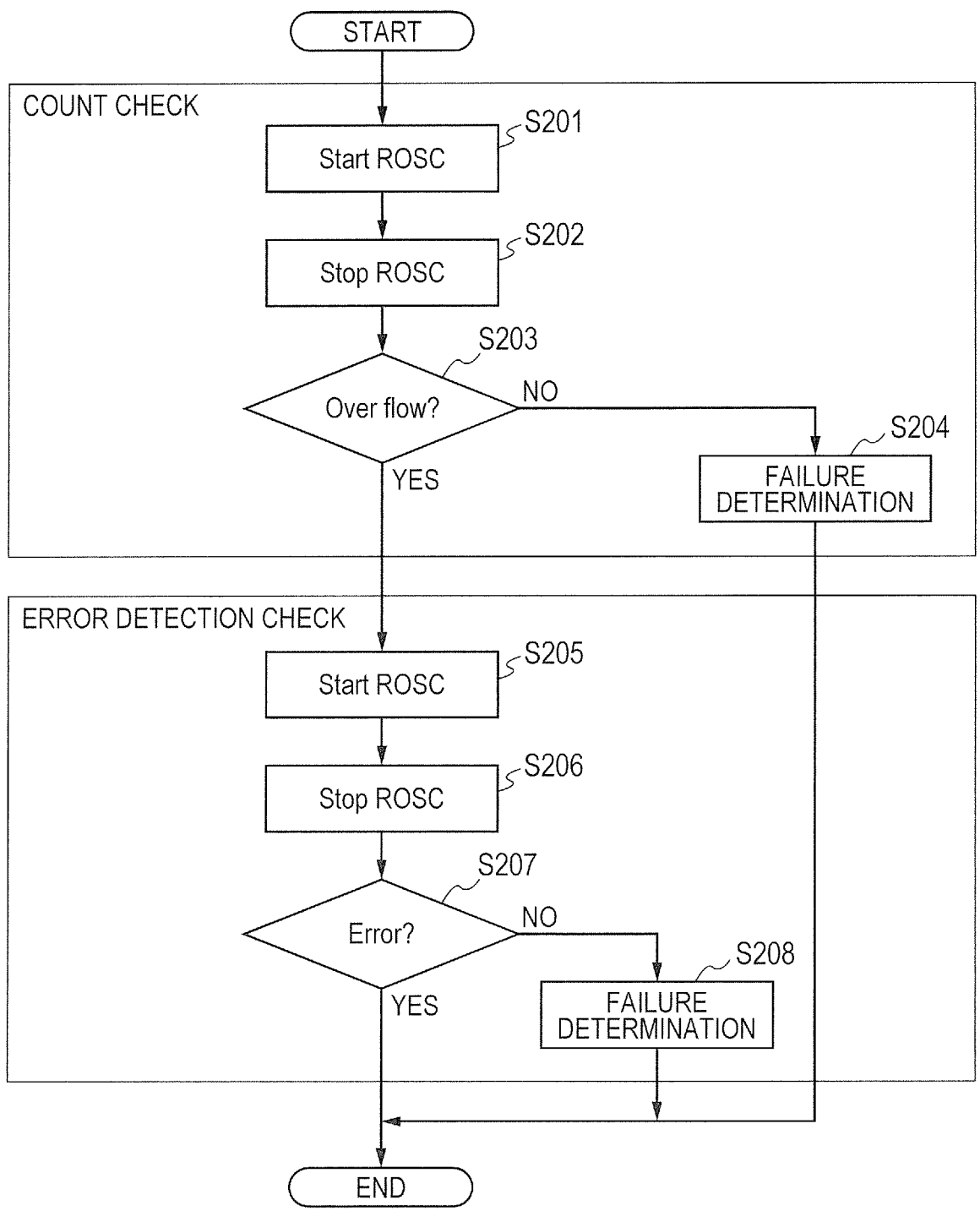
FIG. 12 is a flowchart for showing a self-diagnosis method of the delay monitor provided in the semiconductor system shown in FIG. 2.

FIG. 12 is a flowchart for showing a concrete example of a self-diagnosis method of the delay monitor 12.

As shown in FIG. 12, two checks such as a count check and an error detection check are performed in the self-diagnosis of the delay monitor 12.

In the count check, the self-diagnosis of each ring oscillator of the oscillation unit 121 and each counter of the count unit 122 is performed. First, oscillation of the ring oscillator is started (Step S201), and is stopped after the number of times of oscillation exceeding the upper limit of the count value of the counter elapses (Step S202). Here, in the case where the count by the counter does not overflow (NO in Step S203), it is determined that either the ring oscillator or the counter is broken (Step S204). On the other hand, in the case where the count by the counter overflows (YES in Step S203), it is determined that both the ring oscillator and the counter are normal, and the flow proceeds to the next error detection check.

In the error detection check, the self-diagnosis of each comparison circuit of the comparison unit 123 and each determination circuit of the determination unit 124 is performed. First, oscillation of the ring oscillator is started (Step S205), and is stopped after a predetermined period elapses (Step S206). Thereafter, the number of times of oscillation (the count value by counter) per predetermined period is compared with the threshold value TR set intentionally to cause an error, and it is determined whether or not an error occurs (Step S207). Here, in the case where the determination result by the determination circuit does not indicate an error (NO in Step S207), it is determined that either the comparison circuit or the determination circuit is broken (Step S208). On the other hand, in the case where the determination result by the determination circuit indicates an error (YES in Step S207), it is determined that both the comparison circuit and the determination circuit are normal, and the self-diagnosis of the delay monitor 12 is completed.

(Flow of Monitoring by Each Monitor Circuit)

Next, a flow of monitoring by each monitor circuit will be described.

Figure 13:
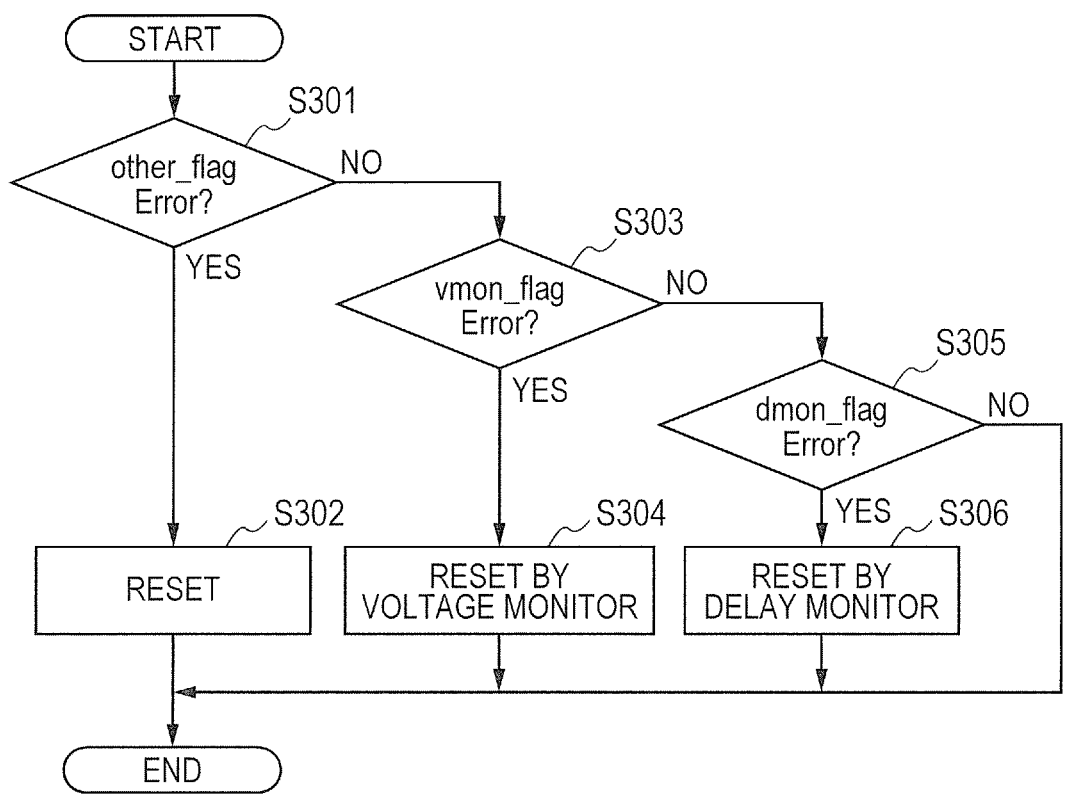
FIG. 13 is a flowchart for showing a flow of monitoring by each monitor circuit provided in the semiconductor system shown in FIG. 2.

FIG. 13 is a flowchart for showing a flow of monitoring by each monitor circuit.

As shown in FIG. 13, in the case where an error is first detected by the monitor circuit other than the voltage monitor 11 and the delay monitor 12 and an error flag rises (YES in Step S301), the circuits (the internal circuit 10, the delay monitor 12, and the like) in the VDD driving region 1 are reset (Step S302). In the case where the error flag does not rise (NO in Step S301) and in the case where an error is detected by the voltage monitor 11 and the error flag rises (YES in Step S303), the circuits in the VDD driving region 1 are reset by the voltage monitor 11 (Step S304). In the case where the error flag by the voltage monitor 11 does not rise (NO in Step S303) and in the case where an error is detected by the delay monitor 12 and the error flag rises (YES in Step S305), the circuits in the VDD driving region 1 are reset by the delay monitor 12 (Step S306). In the case where the error flag by the delay monitor 12 does not rise (NO in Step S305), the normal operation by the semiconductor system SYS1 is continued because no error flags rise.

(Timing Chart)

Next, an example of the operation of the semiconductor system SYS1 will be described using FIG. 14.

Figure 14:
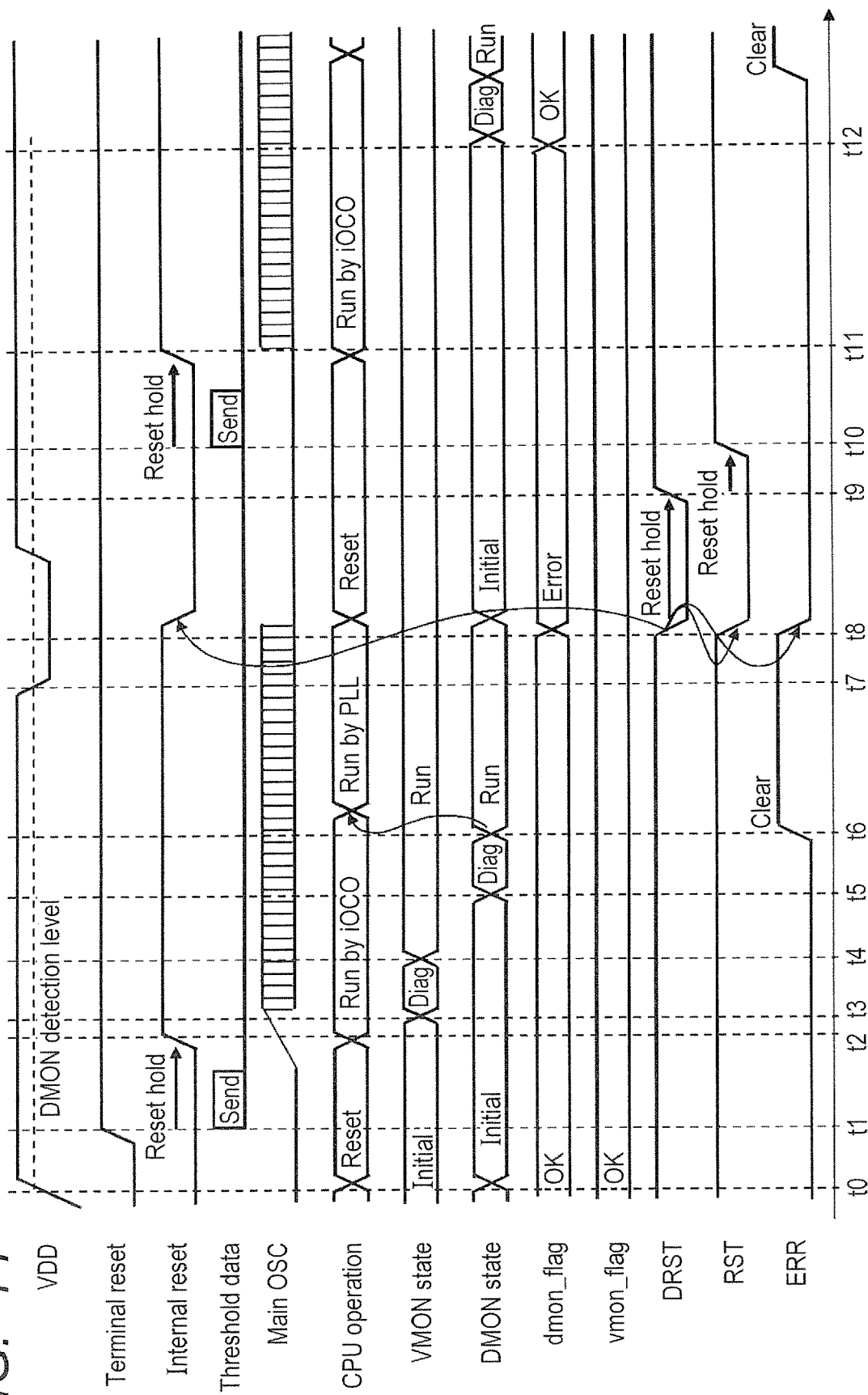
FIG. 14 is a timing chart for showing an operation of the semiconductor system shown in FIG. 2.

FIG. 14 is a timing chart for showing an example of the operation of the semiconductor system SYS1.

In the example of FIG. 14, when the power supply voltage VDD is started first (time t0), the terminal reset of the VDD driving region 1 is canceled (time t1), and the reset inside the VDD driving region 1 (internal reset) is accordingly canceled (time t2). Accordingly, the CPU provided in the internal circuit 10 starts the operation in synchronization with a low-speed clock signal by the built-in oscillator iOCO (time t2). At this time, oscillation by the main oscillator (Main OSC) 17 is also started (time t2).

Thereafter, the CPU performs the self-diagnosis of the voltage monitor (VMON) 11 (time t3). After it is confirmed that there is no problem in the diagnostic result, the voltage monitor 11 starts the monitoring operation (time t4). At this time, although not shown in the drawing, the self-diagnosis of the clock monitor (CLMON) 19 is also performed, and the frequency diagnosis of the clock signal CLK from the main oscillator 17 is performed by using the clock monitor 19 after the self-diagnosis.

After it is confirmed that the power supply voltage VDD and the clock signal CLK supplied to the delay monitor (DMON) 12 are normal, the CPU performs the self-diagnosis of the delay monitor 12 (time t5). After it is confirmed that there is no problem in the diagnostic result, the delay monitor 12 starts the monitoring operation (time t6). Namely, the monitoring operation by all the monitor circuits is started.

Accordingly, the CPU switches the operation clock from a low-speed clock signal by the built-in oscillator iOCO to a high-speed clock signal generated by multiplying the clock signal CLK from the main oscillator 17. Further, the error signal ERR is also cleared. Namely, the semiconductor system SYS1 starts the normal operation including the monitoring operation by each monitor circuit.

Here, when the signal propagation period of time of the critical path in the internal circuit 10 becomes equal to or longer than the allowable maximum propagation period of time due to the drop of the power supply voltage VDD (time t7), the delay monitor 12 detects an error, and activates the reset signal DRST ("L" level) (time t8). Therefore, the reset signal RST and the error signal ERR also become active ("L" level) (time t8). Accordingly, since the reset signal inside the VDD driving region 1 becomes active ("L" level), the internal circuit 10 having the CPU and the delay monitor 12 are initialized. However, the error flag stored in the flag storage register 131 of the delay monitor 12 is held.

Thereafter, when a certain period elapses, the reset signal DRST is canceled (time t9), the reset signal RST is canceled (time t10), and further the internal reset signal is canceled (time t11). Then, the CPU starts the operation in synchronization with the low-speed clock signal by the built-in oscillator iOCO again (time t11). At this time, oscillation is also started by the main oscillator 17 (time t11). Here, the self-diagnosis is performed again only for the delay monitor 12 storing the error flag. It should be noted that the error flag is cleared at the time (after time t12).

In the semiconductor system SYS1, such operations are repeated.

(Relationship Between Delay Monitor and Critical Path)

Figure 15:
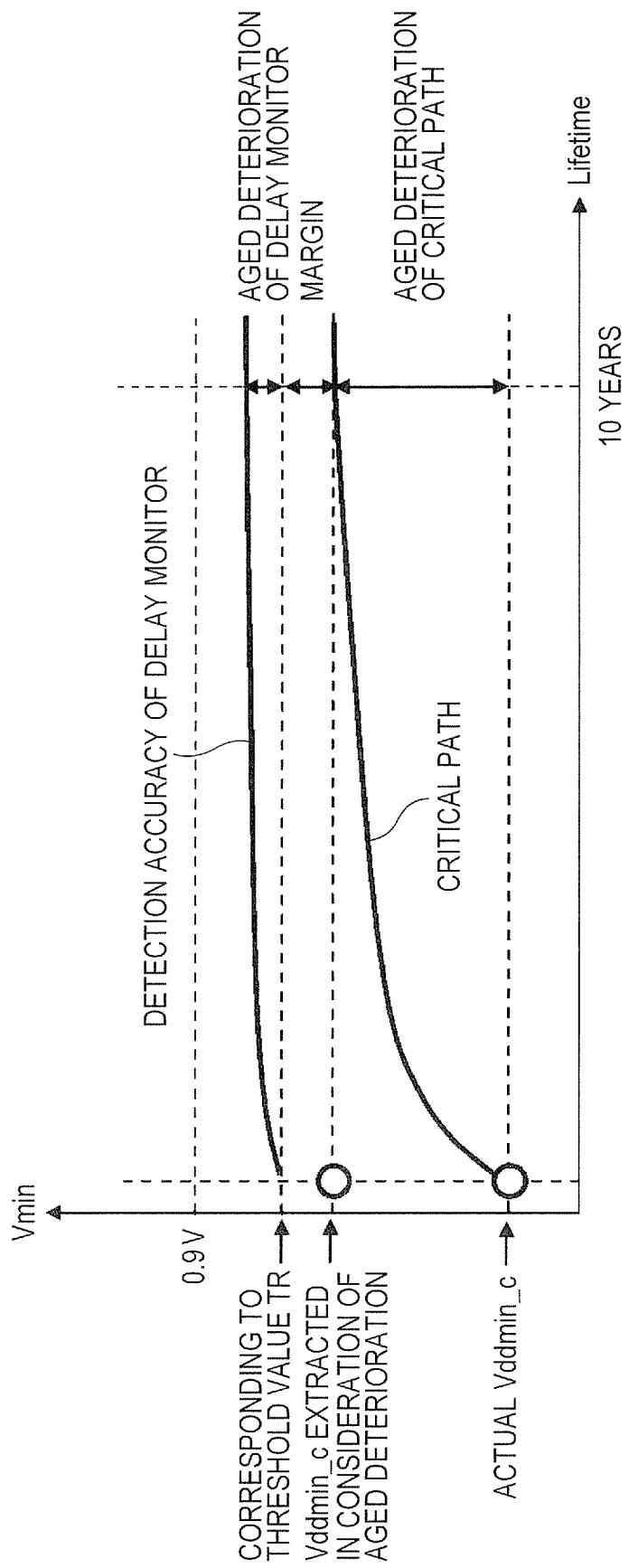
FIG. 15 is a diagram for showing a relationship between the detection accuracy of the delay monitor and a critical path of a circuit to be monitored.

FIG. 15 is a diagram for showing a relationship between the detection accuracy of the delay monitor and the critical path of the circuit to be monitored. With reference to FIG. 15, the lowest operating voltage Vddmin_c of the internal circuit 10 is extracted in consideration of aged deterioration. The value obtained by adding a margin to the lowest operating voltage Vddmin_c is a voltage corresponding to the threshold value TR. Here, as described above, the delay monitor 12 is configured in such a manner that the accuracy error due to aged deterioration becomes as small as possible. Therefore, the power supply voltage VDD at the time of error detection by the delay monitor 12 can be always made equal to or lower than the lower limit value of the power supply voltage VDD that can be detected by the voltage monitor 11.

Figure 16:
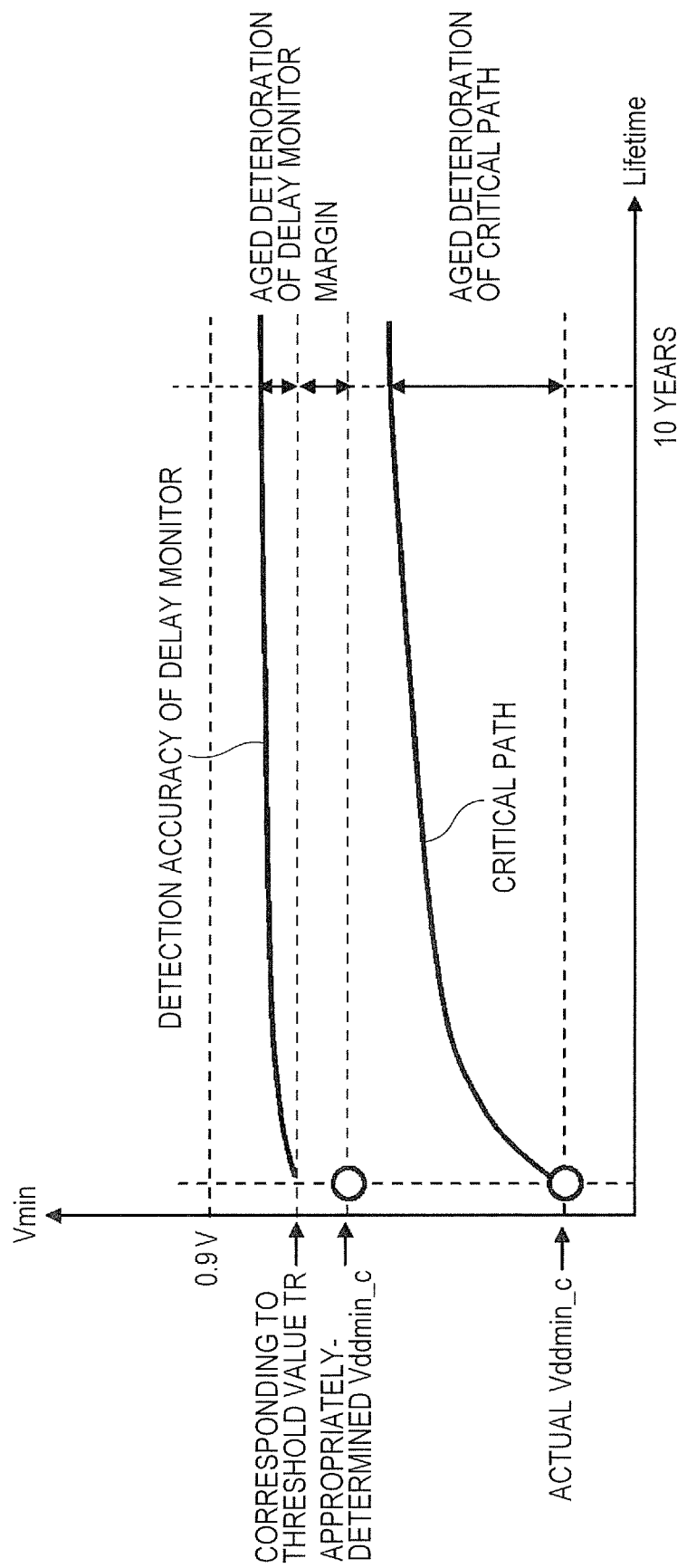
FIG. 16 is a diagram for showing a relationship between the detection accuracy of the delay monitor and the critical path of the circuit to be monitored.

It should be noted that the lowest operating voltage Vddmin_c appropriately determined on the basis of past instances and the like may be used as shown in FIG. 16, instead of extracting the lowest operating voltage Vddmin_c by trimming.

As described above, in the semiconductor system SYS1 according to the first embodiment, the voltage monitor 11 monitors whether or not the power supply voltage VDD has dropped to 0.9V that is the lowest operation guarantee voltage of the internal circuit 10, and the delay monitor 12 monitors whether or not the signal propagation period of time of the critical path in the internal circuit 10 falls within the allowable range even in the voltage range of 0.8V to 0.9V that is the accuracy error range of the voltage monitor 11. Namely, the delay monitor 12 can accurately monitor whether or not the power supply voltage VDD has reached the actual lowest operating voltage of the internal circuit 10 even in the case where the voltage monitor 11 has an accuracy error.

Accordingly, the internal circuit 10 can be designed with a small voltage margin without considering the accuracy error of the voltage monitor 11. Namely, the internal circuit 10 may be designed to, at least, operate in the case where the power supply voltage VDD is equal to or higher than 0.9V in the embodiment. As a result, the internal circuit 10 can improve the operation frequency by relaxing the design restrictions.

It should be noted that in the configuration disclosed in Japanese Unexamined Patent Application Publication No. Hei 8(1996)-274607, the power supply voltage is monitored by measuring the propagation delay period of time using the ring oscillator. However, in the configuration disclosed in Japanese Unexamined Patent Application Publication No. Hei 8(1996)-274607, there is a possibility that the ring oscillator itself becomes not operable due to the drop of the power supply voltage. Namely, it is impossible to guarantee the lowest operating voltage of the ring oscillator itself. Further, the error of the monitoring accuracy is increased due to the aged deterioration of the ring oscillator. In contrast, the lowest operating voltage of the delay monitor 12 having the ring oscillator is guaranteed by the voltage monitor 11 in the semiconductor system SYS1 according to the first embodiment. In addition, the ring oscillator is configured to suppress the accuracy error due to aged deterioration.

The invention achieved by the inventors has been concretely described above on the basis of the embodiment. However, it is obvious that the present invention is not limited to the above-described embodiment, and can be variously changed without departing from the scope thereof.

For example, the delay monitor 12 is not limited to the configuration using the ring oscillator, but can be appropriately changed to a configuration using a delay line and the like. Hereinafter, a modified example of the delay monitor 12 will be briefly described.

(Modified Example of Delay Monitor 12)

Figure 17:
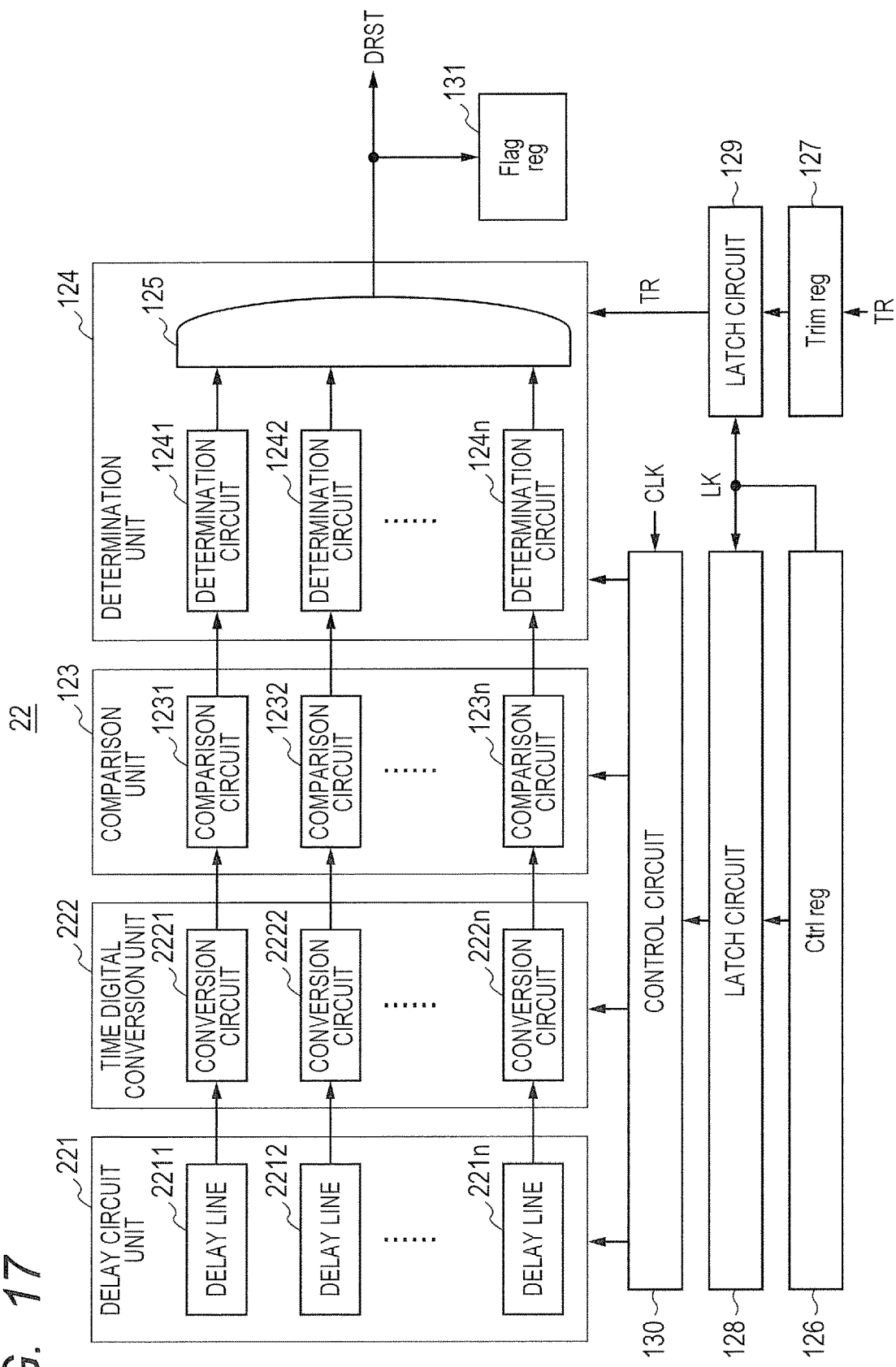
FIG. 17 is a block diagram for showing a modified example of the delay monitor shown in FIG. 4.

FIG. 17 is a diagram for showing a modified example of the delay monitor 12 as a delay monitor 22.

The delay monitor 22 shown in FIG. 17 has a delay circuit unit 221 instead of the oscillation unit 121 and a time digital conversion unit 222 instead of the count unit 122, as compared to the delay monitor 12 shown in FIG. 4.

The delay circuit unit 221 has n delay lines 2211 to 221n having different characteristics. Here, the delay monitor 22 monitors whether or not the signal propagation period of time of the critical path in the internal circuit 10 falls within the allowable range by monitoring a period of time (signal propagation period of time) required from the time a signal is input to each of the delay lines 2211 to 221n having different characteristics to the time the signal is output.

The time digital conversion unit 222 has n conversion circuits 2221 to 222n. The conversion circuits 2221 to 222n convert the signal propagation periods of time of the delay lines 2211 to 221n into digital values, respectively. In addition, the comparison unit 123 compares the digital value of the time digital conversion unit 222 with a preliminarily-set threshold value.

The other configurations of the delay monitor 22 are basically the same as those of the delay monitor 12, and thus the explanation thereof is omitted.

Further, for example, in the semiconductor device according to the above-described first embodiment, the conductivity type (the p-type or the n-type) of the semiconductor substrate, the semiconductor layer, the diffusion layer (diffusion region), or the like may be inverted. Therefore, in the case where one conductivity type of the n-type and the p-type is set to a first conductivity type and the other conductivity type is set to a second conductivity type, the first conductivity type can be set to the p-type and the second conductivity type can be set to the n-type. On the contrary, the first conductivity type can be set to the n-type and the second conductivity type can be set to the p-type.

What is claimed is:

1. A semiconductor device comprising:
   a circuit to be monitored supplied with a first power supply voltage;
   a voltage monitor supplied with a second power supply voltage different from the first power supply voltage and monitors the first power supply voltage; and
   a delay monitor that is supplied with the first power supply voltage and monitors a signal propagation period of time of a critical path in the circuit to be monitored,
   wherein the voltage monitor compares the first power supply voltage with a predetermined reference voltage and outputs a first reset signal when the first power supply voltage is lower than the reference voltage,
   wherein when the signal propagation period of time of the critical path in the circuit to be monitored becomes equal to or longer than a predetermined period of time, the delay monitor outputs a second reset signal, and
   wherein the circuit to be monitored is initialized when ether of the first reset signal or the second reset signal is transferred to the circuit to be monitored.

2. The semiconductor device according to claim 1,
   wherein the delay monitor includes a delay information generation unit supplied with the first power supply voltage and monitors the signal propagation period of time of the critical path in the circuit to be monitored by monitoring delay information generated by the delay information generation unit.

3. The semiconductor device according to claim 2,
   wherein the delay information generation unit has a first ring oscillator supplied with the first power supply voltage, and
   wherein the delay monitor further includes:
   a first counter that counts the number of times of oscillation per predetermined period of oscillation signals output from the first ring oscillator;
   a first comparison circuit that compares the count value of the first counter with a first threshold value; and
   a first determination circuit that determines whether or not the signal propagation period of time of the critical path in the circuit to be monitored falls within an allowable range on the basis of the comparison result by the first comparison circuit.

4. The semiconductor device according to claim 3,
   wherein the first determination circuit determines that the signal propagation period of time of the critical path in the circuit to be monitored falls within the allowable range in the case where the count value of the first counter is larger than the first threshold value, and determines that the signal propagation period of time of the critical path in the circuit to be monitored is out of the allowable range in the case where the count value of the first counter is equal to or smaller than the first threshold value.

5. The semiconductor device according to claim 4,
   wherein the first determination circuit determines that the signal propagation period of time of the critical path in the circuit to be monitored is out of the allowable range in the case where the number of times that the count value of the first counter becomes equal to or smaller than the first threshold value reaches the predetermined number of times.

6. The semiconductor device according to claim 3,
   wherein the first ring oscillator has a plurality of NOR circuits and a plurality of NAND circuits that are alternately provided in a ring shape, and
   wherein the drive capability of each NOR circuit is larger than that of each NAND circuit.

7. The semiconductor device according to claim 6,
   wherein the first ring oscillator further includes:
   a diode provided between a high potential-side voltage terminal of either one of the NOR circuits and the NAND circuits and a power supply voltage terminal to which the first power supply voltage is supplied; and
   a level shifter that shifts the voltage range of an output signal from the either one to the ranges of the first power supply voltage and the ground voltage.

8. The semiconductor device according to claim 6,
   wherein the first ring oscillator further includes a resistance element provided on a ring formed by the NOR circuits and the NAND circuits.

9. The semiconductor device according to claim 3,
   wherein the delay information generation unit further has a second ring oscillator that is supplied with the first power supply voltage and is different in temperature dependency from the first ring oscillator, and
   wherein the delay monitor further includes:
   a second counter that counts the number of times of oscillation per predetermined period of oscillation signals output from the second ring oscillator;
   a second comparison circuit that compares the count value of the second counter with a second threshold value; and
   a second determination circuit that determines whether or not the signal propagation period of time of the critical path in the circuit to be monitored falls within the allowable range on the basis of the comparison result by the second comparison circuit.

10. The semiconductor device according to claim 9,
    wherein the second ring oscillator has temperature dependency opposite to that of the first ring oscillator.

11. The semiconductor device according to claim 2,
    wherein the delay information generation unit has a first signal propagation route that is supplied with the first power supply voltage and outputs an output signal in accordance with an input signal, and wherein the delay monitor further includes:

a first conversion circuit that converts into a digital signal a period of time required from the time an input signal is input to the first signal propagation route to the time an output signal is output;

a first comparison circuit that compares the comparison result by the first conversion circuit with a first threshold value; and a first determination circuit that determines whether or not the signal propagation period of time of the critical path in the circuit to be monitored falls within the allowable range on the basis of the comparison result by the first comparison circuit.

12. The semiconductor device according to claim 1, wherein the delay monitor is configured to operate even in the case where it is determined by the voltage monitor that the first power supply voltage has reached the lowest operation guarantee voltage of the circuit to be monitored.

13. A semiconductor system comprising:

the semiconductor device according to claim 1, and the circuit to be monitored by the semiconductor device.

14. A control method of a semiconductor device, comprising:

monitoring a first power supply voltage supplied to a circuit to be monitored by using a voltage monitor supplied with a second power supply voltage different from the first power supply voltage; and monitoring a signal propagation period of time of a critical path in the circuit to be monitored by using a delay monitor supplied with the first power supply voltage, wherein the voltage monitor compares the first power supply voltage with a predetermined reference voltage, when the first power supply voltage is lower than the reference voltage the voltage monitor outputs a first reset signal, when the signal propagation period of time of a critical path in the circuit to be monitored becomes equal to or longer than a predetermined period of time the delay monitor outputs a second reset signal, when ether of the first reset signal or second reset signal is transferred to the circuit to be monitored the circuit to be monitored is initialized.

15. The control method of the semiconductor device according to claim 14, wherein the signal propagation period of time of the critical path in the circuit to be monitored is monitored by monitoring delay information generated by a delay information generation unit supplied with the first power supply voltage.

* * * * *